United States Patent [19]

Semasa et al.

[11] Patent Number: 5,313,204
[45] Date of Patent: May 17, 1994

[54] ENCODING AND DECODING DEVICES WITH PREDICTOR AND DETECTOR

[75] Inventors: Takayoshi Semasa; Makoto Matsumoto; Yukiyasu Kawahata; Tomohiro Kimura; Fumitaka Ono, all of Kamukura, Japan

[73] Assignee: Mitsubishi Denki Kabushiki Kaisha, Tokyo, Japan

[21] Appl. No.: 871,083

[22] Filed: Apr. 20, 1992

[30] Foreign Application Priority Data

Apr. 25, 1991 [JP] Japan .................. 3-122672
Oct. 30, 1991 [JP] Japan .................. 3-311910

[51] Int. Cl.⁵ .............................. H03M 7/00
[52] U.S. Cl. ........................ 341/107; 341/51
[58] Field of Search .............. 341/106, 107, 51, 55, 341/60, 95, 87, 96; 358/133, 135, 136

[56] References Cited

U.S. PATENT DOCUMENTS

4,363,036 12/1982 Subramaniam .
5,142,283 8/1992 Chevion et al. .............. 341/107
5,155,594 10/1992 Bernstein et al. .............. 358/136

FOREIGN PATENT DOCUMENTS

0381078 8/1990 European Pat. Off. .
400240 12/1990 European Pat. Off. .
2409142 12/1990 Japan .
3300486 11/1991 Japan .

OTHER PUBLICATIONS

European Search Report, Feb. 1993.
A Multi-Purpose VLSI chip for adaptive data compression of bi-level images by Arps, et al. -IBM J. Res. Develop. vol. 32 Nov. 1988.

*Primary Examiner*—Brian K. Young
*Attorney, Agent, or Firm*—Wolf, Greenfield & Sacks

[57] ABSTRACT

Encoding and decoding devices which are capable of increasing the encoding and decoding speed. In arithmetic encoding, there is a possibility of encoding with high efficiency which is very close to the entropy of the information source, but the encoding and decoding time is generally longer than that in another encoding systems such as an MMR encoding system. For example, in a standard facsimile equipment, about 1.3 sec is required for encoding the picture information in an A4-size copy. In prediction encoding, a memory for storing the past reference symbols and the predicted values therefor is necessary for prediction. Since the memory capacity is generally large, a large-capacity RAM is used. The encoding time is therefore greatly dependent on the access speed of the RAM. In the present invention, a high-speed register for storing the predicted value for a special symbol pattern is provided separately from the RAM so that the predicted value of the special symbol pattern is read from this register, thereby enabling high-speed encoding.

19 Claims, 27 Drawing Sheets

DIRECTION OF SCANNING

X : PIXEL BEING ENCODED
A ~ L : REFERENCE PIXELS

| REFERENCE SYMBOL PATTERN | DEGREE OF THE SYMBOL BEING ENCODED | PREDICTED VALUE OF THE SYMBOL BEING ENCODED |
|---|---|---|
| 000 --- 00 | 16 | 0 |
| 000 --- 01 | 14 | 0 |
| ⋮ | ⋮ | ⋮ |
| 011 --- 01 | 4 | 1 |
| ⋮ | ⋮ | ⋮ |

$2^{12}$ PATTERNS

←12 SYMBOLS→
(THE MAXIMAM OF THE DEGREE IS ASSUMED TO BE 16)

| DEGREE | REGION WIDTH CORRESPONDING TO DEGREE |
|---|---|
| 1 | '8000' hex |
| 2 | '4000' hex |
| 3 | '2000' hex |
| ⋮ | ⋮ |
| ⋮ | ⋮ |
| 15 | '0002' hex |
| 16 | '0001' hex |

NUMBER OF "DEGREES"

Fig. 28 PRIOR ART

ENCODING AND DECODING DEVICES WITH PREDICTOR AND DETECTOR

BACKGROUND OF THE INVENTION

1. Field of the Invention

The present invention relates to encoding and decoding devices and, more particularly, to encoding and decoding devices which are used for a facsimile equipment so as to encode and decode picture information and the like.

2. Description of the Related Art

In encoding a Markov source such as picture information, a technique of predicting a symbol which has not been encoded on the basis of the value of an encoded symbol has recently been adopted. This is a technique of predicting the symbols which are the objects of the current encoding from the values of reference symbols which have already been encoded in the output symbol stream of an information source, classifying the prediction error symbols into several groups according to percentages of accurate prediction which correspond to the values of the reference symbols, and appropriately encoding the prediction error symbols in the respective groups.

Hereinunder, the generation of the prediction error symbols will be referred to as "prediction conversion", the classification of the prediction error symbols into several groups will be referred to as "classification", and the identification data of the group, namely, the index which indicates the percentage of accurate prediction will be referred to as "order". The prediction error symbols which are to be encoded will be referred to as "prediction error symbols". The values of the plurality of reference symbols will be referred to as "reference symbol pattern".

As a method of prediction conversion and the selection of order, an adaptive processing technique which copes with a local change of the statistic nature of an information source is disclosed (Japanese Patent Application No. Hei 1-127134).

As to the technique of encoding the prediction error symbols, a subtraction type arithmetic encoding method is disclosed in, for example, "An Overview of the Basic Principle of the Q-coder Adaptive Binary Arithmetic Coder" (*IBM Journal of Research and Development, Vol. 32, No. 6, Nov. 1988*) and Japanese Patent Laid-Open No. Hei 2-202267. This method is a kind of number line representation encoding method, in which a symbol list is mapped between 0.0 and 1.0 on a number line and the coordinates are encoded as code words. The subtraction type arithmetic encoding method is characterized by the fact that when the number line is divided in accordance with the produced symbols so as to use the coordinates of the divisions as the code words, the division of the number line is executed only by addition and subtraction.

An example of a conventional process of prediction conversion, classification and encoding will be explained with reference to FIG. 25. In order to make the explanation easy to understand, it is here assumed that the information source is binary image signals, that the reference symbols are the twelve pixels in the neighborhood of the encoding pixel in FIG. 26, Vol. 32, and that the number of classifications (i.e, the number of groups) is sixteen. In other words, it is assumed that twelve pixels have already been encoded and a thirteenth pixel is now being encoded.

In FIG. 25, reference symbols are selected and retrieved from the list of information source symbols 101 by a reference symbol generator 1. In this example, the encoded twelve information source symbols are output as a reference symbol pattern 102. An order and predicted value memory 2 outputs the predicted value 104 and the order 103 of the symbol which is the object of the current encoding operation (this symbol will be referred to as "the encoding symbol" hereinunder) in accordance with the reference symbol pattern 102. A prediction converter 3 generates a prediction error symbol 105 on the basis of the value of the symbol being encoded and the predicted value 104. A region width table 4 converts the order 103 into a region width signal 106 which determines the range allowed to the arithmetic code. An arithmetic coder 5 encodes the prediction error symbol 105 in accordance with the region width signal 106 and outputs a code bit stream. An order and predicted value controller 6 controls the reading and updating operations of the order and predicted value memory 2 on the basis of the prediction error symbol 105.

Since the number of reference symbols is twelve, the order and predicted value memory 2 requires $2^{12}$ order and predicted value table entries, as shown in FIG. 27. Since the number of groups for classification is 16, the order takes a value of 1 to 16 in order to identify the group. It is here assumed that the higher the order is, the higher is the percentage of accurate prediction.

The operation of the conventional process shown in FIG. 25 will now be explained. When the information symbol source symbol 101 (picture signal) is produced from the information source (not shown), the reference symbol generator 1 stores the list of the symbol 101 and selects the signals of the latest twelve encoded pixels and outputs them as the reference symbol pattern 102, as shown in FIG. 26. The order and predicted value memory 2 outputs the predicted value 104 and the order 103 of the encoding symbol from the table shown in FIG. 27 on the basis of the reference symbol pattern 102. The information on the order 103 is converted into the region width signal 106 by the region width table 4 shown in FIG. 28.

The prediction converter 3 obtains the exclusive OR of the encoding symbol 101 in the information source symbol stream and the predicted value 104, and generates the prediction error symbol 105. The prediction error symbol 105 is an MPS (More Probable Symbol) when the prediction is accurate, and an LPS (Less Probable Symbol) when the prediction is wrong. In this example, since the encoding symbol is a binary image signal and the MPS is set at "0" and the LPS at "1", an EX OR gate is used for the prediction converter 3, so that "0" (MPS) is output when the prediction is accurate, and "1" (LPS) is output when the prediction is wrong.

The arithmetic coder 5 maps the prediction error symbol 105 on the number line on the basis of the region width signal 106, thereby executing encoding.

If an i-th symbol is represented by $a_i$ in the prediction error symbol list, and the mapping range (allotted region) of the LPS is represented by S (assigned fixed value by each order), the mapping range (effective region) $A_i$ of the symbol list and the coordinate $C_j$ of the lower boundary thereof at the i th point are updated as follows if the MPS region is taken below the mapping range (effective region) $A_i$:

When the symbol $a_i$ is an MPS, $$A_i = A_{i-1} - S$$

$$C_i = C_{i-1}$$

When the symbol $a_i$ is an LPS, $$A_i = S$$

$$C_i = C_{i-1} + (A_{i-i} - S).$$

When the effective region $A_i$ is not more than ½, $A_i$ is multiplied by an m-th power of 2 in order to enhance the accuracy. At this time, the overflow portion (the portion over the decimal point) of the coordinate $C_j$ is output as a code bit stream. The process of multiplying the effective region $A_i$ by an m-th power of 2 will hereinunder be referred to as "renormalization". The renormalization is represented as follows:

$$\text{Updated } A_i = A_i^* 2 (¼ < \text{update } A_i \leq ½)$$

$$\text{Updated } C = C^* 2^m$$

In arithmetic encoding, it is known that encoding is realized with high efficiency which is very close to the entropy of the information source by setting the mapping range (allotted region) S at the occurence probability (=prediction error probability) of the LPS. Arithmetic encoding is therefore enabled with high efficiency by the above-described processing if the S value is set in advance so as to be suitable for the percentage of accurate prediction, which corresponds to the order.

FIG. 28 shows an example of the correspondence of an order to a region width. Each value in the table is obtained by multiplying the value in the above-described formula by $2^{16}$.

The adaptive processing of prediction and classification will now be explained.

The order and predicted value controller 6 counts the number of consecutive MPS's and LPS's in the list of the prediction error symbols 105. It can be considered that if k MPS's have been detected, the prediction is more accurate, and that when l LPS's have been detected, the prediction has a strong possibility of being wrong. Therefore, the contents of the order and predicted value memory 2 are updated in the following steps in the respective cases. The values k and l are set in the order and predicted value controller 6 in advance in accordance with each order.

When l LPS's have been detected, it means that the prediction in the reference symbol pattern 102 is wrong.

In this case, the order and predicted value memory 2 subtracts 1 from the order which corresponds to the reference symbol pattern 102 at that time. This operation is executed in order to adapt the order and predicted value to the information source of the symbol which is the object of the current encoding operation by reducing the order, which indicates the percentage of accurate prediction. When the order is the lowest value and further subtraction is impossible, the predicted value is inverted. By this operation, the predicted value having an excessively low percentage of accurate prediction is updated.

When k MPS's have been detected, it means that the prediction in the reference symbol pattern is accurate.

In this case, the order and predicted value memory 2 adds 1 to the order which corresponds to the reference symbol pattern 102 at that time. This operation is executed in order to adapt the order and predicted value to the information source of the symbol which is the object of the current encoding operation by increasing the order, which indicates the percentage of accurate prediction. When the order is the highest value, no addition is executed. According to this operation, it is possible to narrow the region width and suppress the amount of output from the arithmetic coder 5 by increasing the order when the prediction is very accurate. In this way, the order and the predicted value controller 6 updates the contents of the order and predicted value memory 2 in accordance with the statistic nature of the information source, and the arithmetic encoding with a high encoding efficiency is realized.

In this conventional device, a general purpose RAM is essential in the order and predicted value memory 2 because a large capacity ($2^{12} \times 5$ bits, in this example) is required. In arithmetic encoding based on a Markov model, the generation of the reference symbol pattern 102, the retrieval of the order and predicted value memory 2 and the calculation of the region on the number line are executed for each symbol, as is clear from the above explanation. For example, in a standard facsimile equipment, since picture information is encoded at a resolution of 8 horizontal pixels/mm and 7.7 vertical lines/mm, about 1.3 seconds is required for encoding the picture information in an A4 size copy. That is, the processing speed of the conventional device based on a Markov model is much lower than that of an encoding or decoding device based on another coding system such as an MMR encoding system.

SUMMARY OF THE INVENTION

Accordingly, it is an object of the present invention to eliminate the above described problems in the related art and to provide encoding and decoding devices equipped with an order and predicted value memory which is capable of accessing predetermined specific reference symbol patterns at a high speed, thereby enabling a significant increase in processing speed.

It is another object of the present invention to eliminate the above described problems in the related art and provide encoding and decoding devices which are capable of retrieving the order and predicted value table for a symbol which is to be the object of the next encoding operation in parallel with the calculation of the region on the number line for the symbol as the object of the current encoding operation, thereby further enabling a significant increase in processing speed.

It is still another object of the present invention to eliminate the above described problems in the related art and provide encoding and decoding device which are capable of batch processing of the calculation of the region on the number line when consecutive reference symbol patterns are specified, thereby significantly increasing the processing speed.

To achieve this aim, in a first aspect of the present invention, there is provided an encoding device for encoding an output symbol stream which is output from an information source by predicting the value of each of the symbols which are the objects of encoding and which constitute the output symbol stream from the values of a plurality of reference symbols at predetermined positions in the output symbol list which is output from the information source, and encoding a prediction error signal which indicates the difference between the predicted value and the actual value of the encoding symbol. The encoding device comprises:

(a) a reloadable order and predicted value memory for storing the value of the encoding symbol which is predicted from the values of the plurality of reference symbols, and the order which is one of the identification data of the groups of predictions classified by percentage of accurate prediction and, hence, which is the indicator of the percentage of accurate prediction;

(b) a specific reference symbol pattern detector for detecting that the values of the plurality of reference symbols are a predetermined specific reference symbol pattern or one of a number of predetermined specific reference symbol patterns;

(c) at least one specific reloadable order and predicted value register for storing the order and the predicted value when the specific reference symbol pattern is detected, the register being accessible at a higher speed than the order and predicted value memory;

(d) a selector for choosing between the output of the order and predicted value memory and the output of the specific order and predicted value register in accordance with the detection signal output from the detector;

(e) a prediction converter for outputting the prediction error signal which indicates the difference between the predicted value selected and output by the selector and the actual value of the encoding symbol;

(f) an arithmetic coder for encoding the prediction error signal on the basis of the information on the predicted value and the order which are selected and output by the selector; and (g) an order and predicted value controller for judging whether or not the actual value of the encoding symbol is coincident with the predicted value, and updating the predicted value and the order which correspond to the values of the plurality of reference symbols in the order and predicted value memory or in the specific order and predicted value register in accordance with the result of the judgment.

According to the encoding device provided in the first aspect of the present invention, when the plurality of reference symbols are in a specific state, the specific order and predicted value register which is capable of processing at a higher speed is selected at the time of reading and updating the order and the predicted value at a higher speed and, in the other cases, the order and predicted value memory is selected. In this way, the encoding speed is increased.

In a second aspect of the present invention, there is provided a decoding device for decoding a code bit stream obtained by encoding an output symbol stream, which is output from a information source by predicting each of the symbols which are the objects of encoding and which constitute the output symbol stream from the values of a plurality of reference symbols at predetermined positions in the output symbol list and encoding a prediction error signal which indicates the difference between the predicted value and the actual value of the encoding symbol, the decoding operation being executed while the symbol being decoded, which is the object of decoding, is predicted from the values of the plurality of reference symbols. The decoding device comprises:

(a) a reloadable order and predicted value memory for storing the value of the encoding symbol which is predicted from the values of the plurality of reference symbols, and the order which is one of the identification data of the groups of predictions classified by percentage of accurate prediction and, hence, which is the indicator of the percentage of accurate prediction;

(b) a specific reference symbol pattern detector for detecting that the values of the plurality of reference symbols are a predetermined reference symbol specific pattern or one of a number of predetermined specific patterns;

(c) at least one specific reloadable order and predicted value register for storing the order and the predicted value when the specific reference symbol pattern is detected;

(d) a selector for choosing between the output of the order and predicted value memory and the output of the specific order and predicted value register in accordance with the detection signal output from the detector;

(e) an arithmetic decoder for decoding the sign bit list on the basis of the information on the order which is selected and output by the selector and outputting a prediction error signal;

(f) a prediction inverter for converting the prediction error signal output from the arithmetic decoder into the output symbol stream which is output from the information source on the basis of the information on the predicted value which is selected and output by the selector; and (g) an order and predicted value controller for judging whether or not the actual value of the decoded symbol is coincident with the predicted value, and updating the predicted value and the order which correspond to the values of the plurality of reference symbols in the order and predicted value memory or in the specific order and predicted value register in accordance with the result of the judgment.

According to the decoding device provided in the second aspect of the present invention, when the plurality of reference symbols are a specific reference symbol pattern, the specific order and predicted value register which is capable of processing at a higher speed is selected at the time of reading and updating the orders and the predicted values, and in the other cases, the order and predicted value memory is selected. In this way, the decoding speed is increased.

In a third aspect of the present invention, there is provided an encoding device for encoding an output symbol stream which is output from an information source by predicting the value of each of the symbols which are the objects of encoding and which constitute the output symbol stream from the values of a plurality of reference symbols at predetermined positions in the output symbol stream which is output from the information source, and encoding a prediction error signal which indicates the difference between the predicted value and the actual value of the encoding symbol. The encoding device comprises:

(a) a reloadable order and predicted value memory for storing the value of the symbol being encoded which is predicted from the values of the plurality of reference symbols, and the order which is one of the identification data of the groups of predictions classified by percentage of accurate prediction and, hence, which is the indicator of the percentage of accurate prediction;

(b) an order and predicted value controller for judging whether or not the actual value of the encoding symbol is coincident with the predicted value, and updating the predicted value and the order which correspond to the values of the plurality of reference symbols in the order and predicted value memory in accordance with the result of the judgment;

(c) an order and predicted value temporary register for storing the predicted value and the order of the encoding symbol which are read out of the order and predicted value memory, and, if necessary, storing the predicted value and the order of the symbol which is the object of the preceding encoding, the predicted value and the order having been updated by the order and predicted value controller;

(d) a detector for judging whether or not the values of the plurality of reference symbols for the encoding symbol ar coincident with the values of the plurality of reference symbols for the symbol which is the object of the preceding encoding, and updating the contents of the order and predicted value temporary register in accordance with the result of the judgment;

(e) a prediction converter for outputting the prediction error signal which indicates the difference between the predicted value output from the order and predicted value temporary register and the actual value of the encoding symbol; and (f) an arithmetic coder for encoding the prediction error signal on the basis of the information on the order which is output from the order and predicted value temporary register.

According to the encoding device provided in the third aspect of the present invention, since it is possible to choose between the updated predicted value and order for the symbol which is the object of the preceding encoding and the output signal of the order and predicted value memory as the predicted value and the order which are used for the encoding processing depending upon whether or not the values of the plurality of reference symbols for the encoding symbol are coincident with the values of the plurality of reference symbols for the symbol which is the object of the preceding encoding, the encoding speed is increased.

In a fourth aspect of the present invention, there is provided a decoding device for decoding a code bit stream obtained by encoding an output symbol stream which is output from an information source by predicting each of the symbols which are the objects of encoding and which constitute the output symbol stream from the values of a plurality of reference symbols at predetermined positions in the output symbol stream and encoding a prediction error signal which indicates the difference between the predicted value and the actual value of the encoding symbol, the decoding operation being executed while the symbol being decoded, which is the object of decoding, is predicted from the values of the plurality of reference symbols. The decoding device comprises:

(a) a reloadable order and predicted value memory for storing the value of the encoding symbol which is predicted from the values of the plurality of reference symbols, and the order which is one of the identification data of the groups of predictions classified by percentage of accurate prediction and, hence, which is the indicator of the percentage of accurate prediction;

(b) an order and predicted value controller for judging whether or not the actual value of the symbol being decoded is coincident with the predicted value, and updating the predicted value and the order for the values of the plurality of reference symbols in the order and predicted value memory in accordance with the result of the judgment;

(c) an order and predicted value temporary register for storing the predicted value and the order of the symbol being decoded which are read out of the order and predicted value memory, and, if necessary, storing the predicted value and the order of the symbol which is the object of the preceding decoding, the predicted value and the order having been updated by the order and predicted value controller;

(d) a detector for judging whether or not the values of the plurality of reference symbols for the symbol being decoded are coincident with values of the plurality of reference symbols for the symbol which is the object of the preceding decoding, and updating the contents of the order and predicted value temporary register in accordance with the result of the judgment;

(e) a selector for selecting one set of predicted value and order from the plural sets of the outputs of the order and predicted value memory for values of the plurality of reference symbols;

(f) an arithmetic decoder for decoding the code bit stream on the basis of the information on the predicted value and the order which are selected by the selector and outputting a prediction error signal; and (g) a prediction inverter for reproducing the output symbol of the information source on the basis of the prediction error signal output from the arithmetic decoder and the predicted value selected by the selector.

According to the decoding device provided in the fourth aspect of the present invention, since it is possible to choose between the updated predicted value and order for the symbol which is the object of the preceding decoding and the output signal of the order and predicted value memory as the predicted value and the order which are used for the decoding processing depending upon whether or not the values of the plurality of reference symbols for the symbol being decoded are coincident with the values of the plurality of reference symbols for the symbol which is the object of the preceding decoding, the decoding speed is increased.

In a fifth aspect of the present invention, there is provided an encoding device for encoding an output symbol list which is output from an information source by predicting the value of each of the symbols, which are the objects of encoding and which constitute the output symbol stream from the values of a plurality of reference symbols at predetermined positions in the output symbol stream which is output from the information source, and encoding a prediction error signal which indicates the difference between the predicted value and the actual value of the encoding symbol. The encoding device comprises:

(a) a reloadable order and predicted value memory for storing the value of the encoding symbol which is predicted from the values of the plurality of reference symbols, and the order which is one of the identification data of the groups of predictions classified by percentage of accurate prediction and, hence, which is the indicator of the percentage of accurate prediction;

(b) a detector for detecting that all the values of the plurality of reference symbols for a plurality of consecutive encoding symbols are a specific pattern and that all the predicted values of the encoding symbols are coincident with the actual values thereof;

(c) a prediction converter for calculating the prediction error of the encoding symbol on the basis of the predicted value stored in the order and predicted value memory;

(d) an order and predicted value controller for judging whether or not the actual value of the encoding symbol is coincident with the predicted value, and updating the predicted value and the order which correspond to the values of the plurality of reference symbols in the order and predicted value memory in accordance with the result of the judgment; and (e) an arithmetic coder for encoding the prediction error signal which is calculated by the prediction converter on the basis of the information on the order stored in the order and predicted value memory.

According to the encoding device provided in the fifth aspect of the present invention, since batch processing of a plurality of consecutive symbols being encoded by the arithmetic coder is possible when the values of the plurality of reference symbols for the plurality of consecutive symbols being encoded are a specific pattern, the encoding speed is increased.

In a sixth aspect of the present invention, there is provided a decoding device for decoding a code bit stream obtained by encoding an output symbol stream which is output from an information source by predicting each of the symbols which are the objects of encoding and which constitute the output symbol stream from the values of a plurality of reference symbols at predetermined positions in the output symbol stream, and encoding a prediction error signal which indicates the difference between the predicted value and th actual value of the encoding encoded, the decoding operation being executed while the symbol being decoded, which is the object of decoding, is predicted from the values of the plurality of reference symbols. The decoding device comprises:

(a) a reloadable order and predicted value memory for storing the value of the encoding symbol which is predicted from the values of the plurality of reference symbols, and the order which is one of the identification data of the groups of perditions classified by percentage of accurate prediction and, hence, which is the indicator of the percentage of accurate prediction;

(b) a detector for detecting that all the values of the plurality of reference symbols for a plurality of consecutive symbols being decoded are a specific reference symbol pattern if it is assumed that the predicted values of the plurality of consecutive symbols being decoded are coincident with the actual values thereof;

(c) an arithmetic decoder for decoding the code bit stream and generating the prediction error signal on the basis of the information on the order stored in the degree and predicted value memory;

(d) a prediction inverter for reproducing the symbol being decoded on the basis of the prediction error signal generated by the arithmetic decoder and the predicted value output from the order and predicted value memory; and (e) an order and predicted value controller for judging whether or not the decoded symbol is coincident with the predicted value, and updating the predicted value and the order which correspond to the values of the plurality of reference symbols in the order and predicted value memory in accordance with the result of the judgment.

According to the decoding device provided in the sixth aspect of the present invention, since batch processing of a plurality of consecutive symbols being decoded by the arithmetic decoder is possible when the values of the plurality of reference symbols for the plurality of consecutive symbols being decoded are a specific reference symbol pattern, the encoding speed is increased.

The above and other objects, features and advantages of the present invention will become clear from the following description of the preferred embodiments thereof, taken in conjunction with the accompanying drawings.

BRIEF DESCRIPTION OF THE DRAWINGS

FIG. 28 shows the contents of a region width table in the encoding device shown in FIG. 25.

DESCRIPTION OF THE PREFERRED EMBODIMENTS

Embodiment 1

Figure 1:
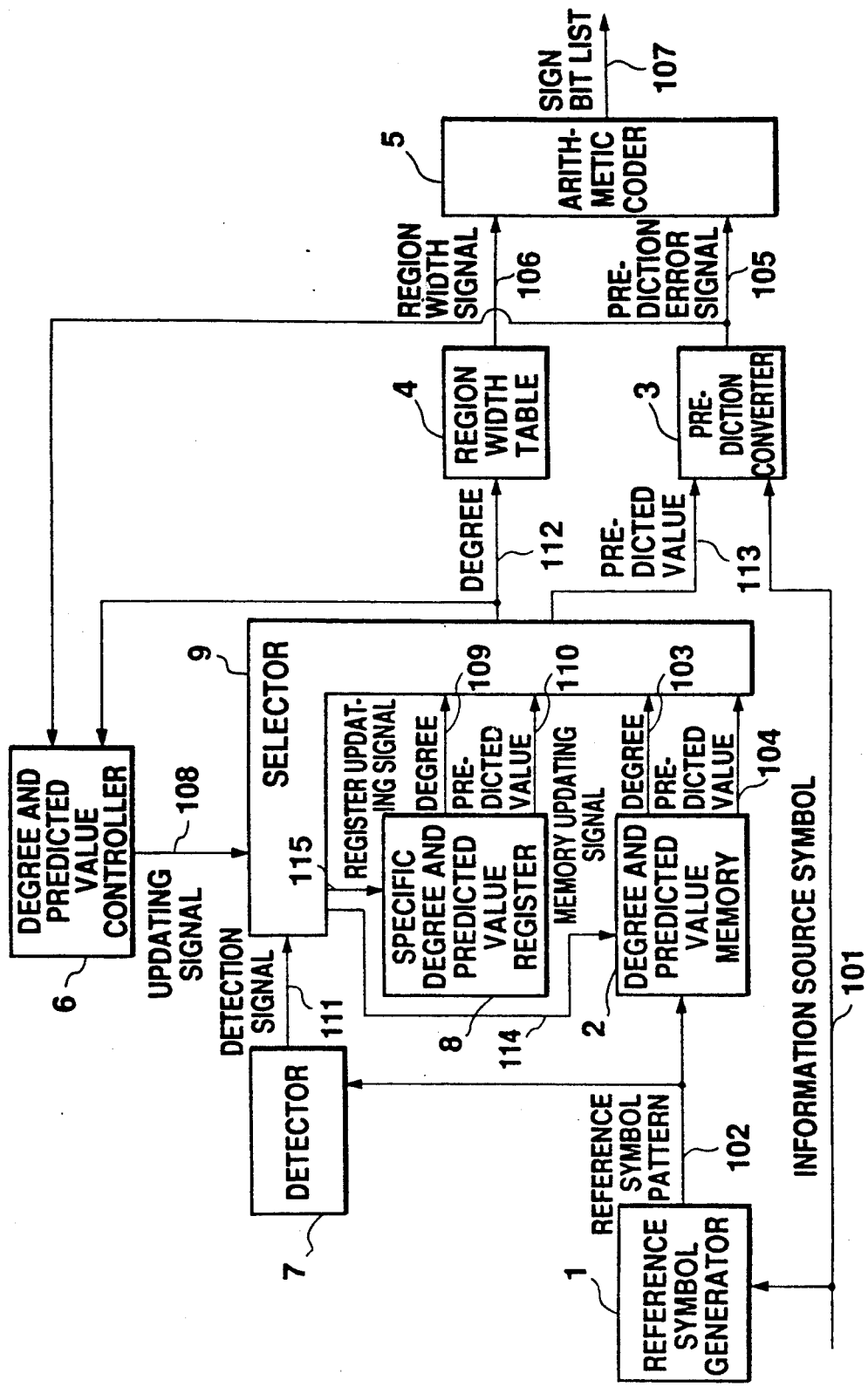
FIG. 1 is a block diagram of the structure of an embodiment of an encoding device according to a first aspect of the present invention.
Figure 25:
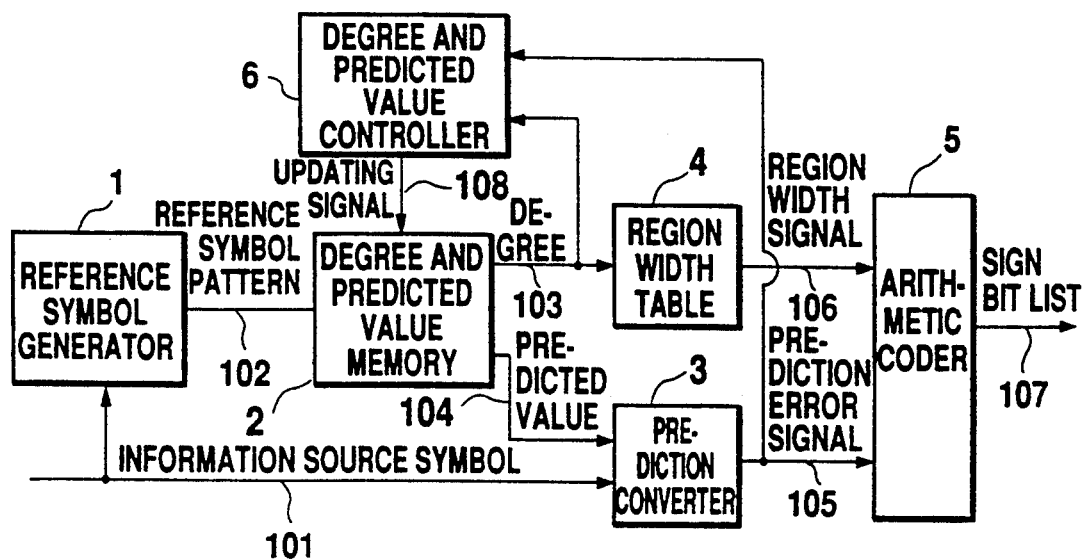
FIG. 25 is a block diagram of a conventional encoding device.
Figures 26, 27:
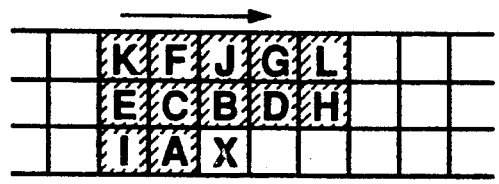
FIG. 26 shows the positions of the reference symbols which are used for encoding by the encoding device shown in FIG. 25.
FIG. 27 shows the contents of an order and predicted value table in the encoding device shown in FIG. 25.

FIG. 1 shows an embodiment of an encoding device according to a first aspect of the present invention. The characteristic of the encoding device shown in FIG. 1 as compared with the conventional encoding device shown in FIG. 25 is that the former is provided with a detector 7 for detecting whether or not all the twelve pixels of the reference symbol pattern 102 shown in FIG. 26 are "0" (white pixels), a specific order and predicted value register 8 for storing the order and the predicted value when all the twelve pixels are "0", and a selector 9 for switching between the outputs of the order and predicted value memory 2 and the outputs of the register 8, and the updating signal to the order and predicted value memory 2 and the updating signal to the specific order and predicted value register 8.

Figure 2:
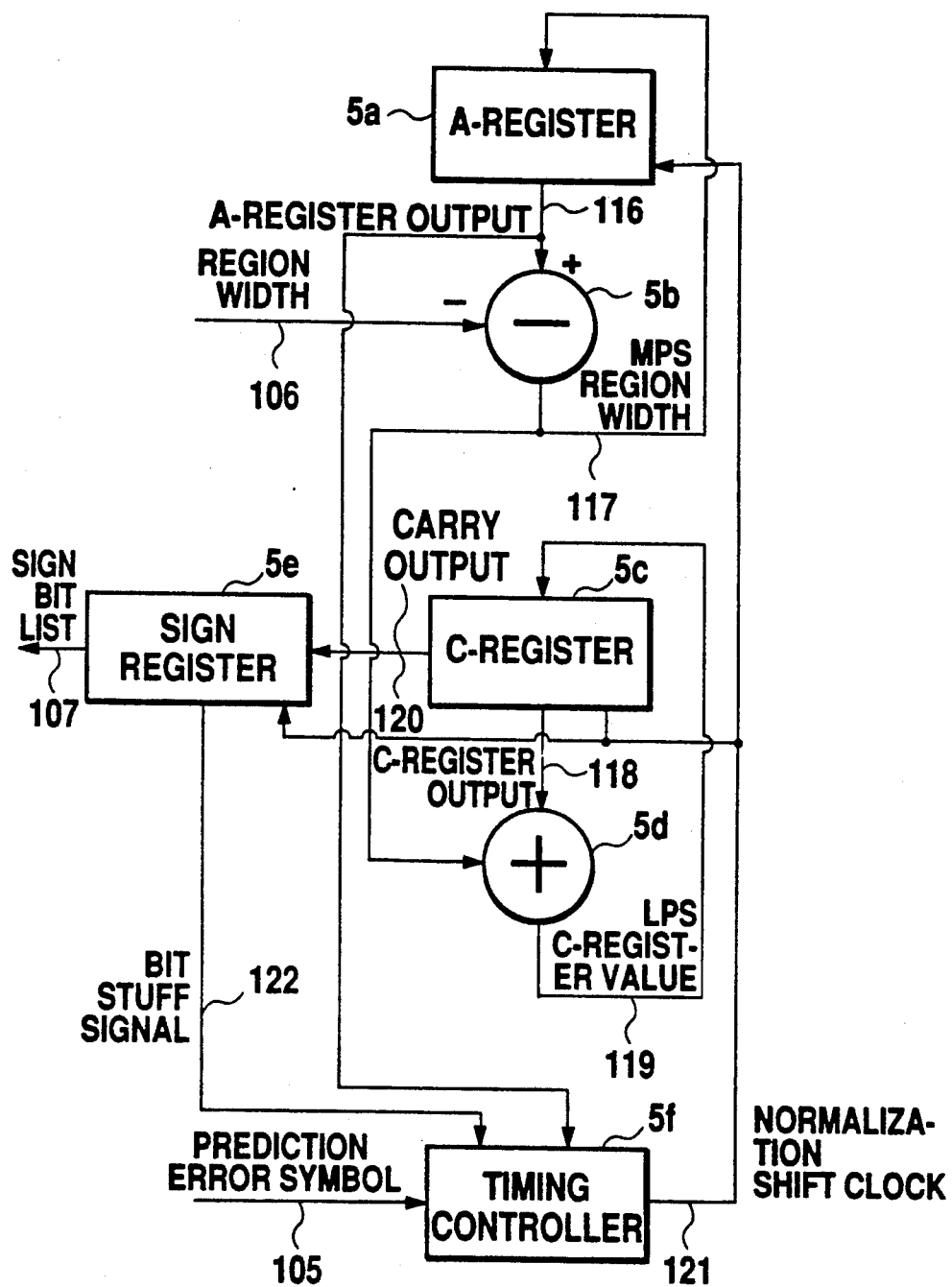
FIG. 2 is a block diagram of the internal structure of an arithmetic coder in the encoding device shown in FIG. 1.

FIG. 2 is a block diagram of the internal structure of the arithmetic coder 5. In FIG. 2, the effective region $A_i$ on the number line is stored in an A-register 5a and an MPS region width 117 is calculated by a subtracter 5b. A coordinate 118 of the lower boundary is stored in a C-register 5c. The C-register value 119 in the case of an LPS is calculated by an adder 5d. A code register 5e temporarily stores a carry output 120, which is an overflow (shift out) signal of the C-register 5c, and executes a carrying operation at the time of updating the C-register 5c. When the contents of the code bits stored in the code register 5e are eight consecutive "1"s, the code register 5e inserts "0" from below the last bit so that the influence of the subsequent carrying operations is limited to the inserted "0" or later bits (this processing will be referred to as "bit stuff processing" hereinunder). A timing controller 5f controls the operation of the arithmetic coder 5.

The operation of this embodiment will now be explained.

Figure 3:
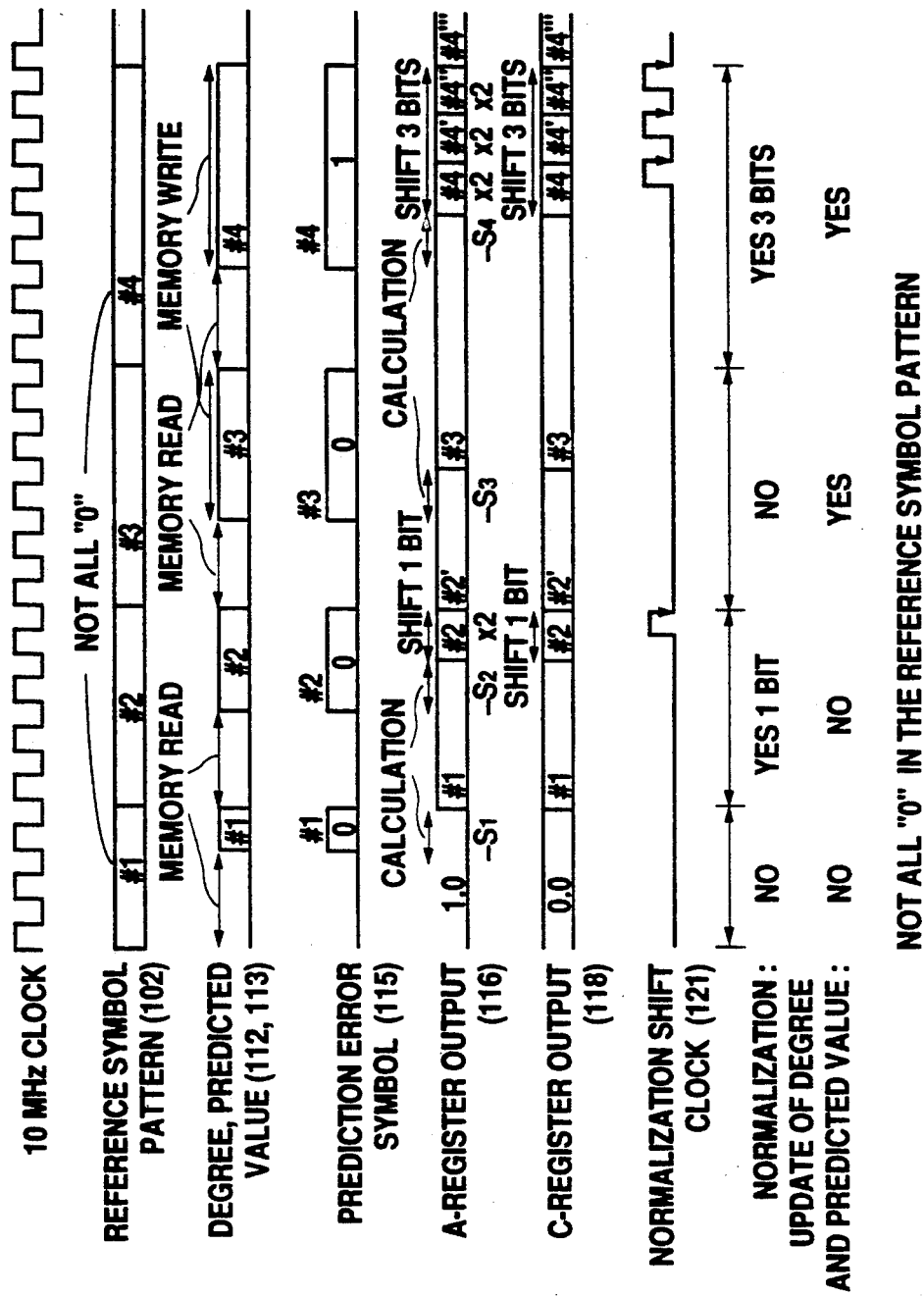
FIG. 3 is a timing chart of an example of the operation of the encoding device shown in FIG. 1.
Figure 4:
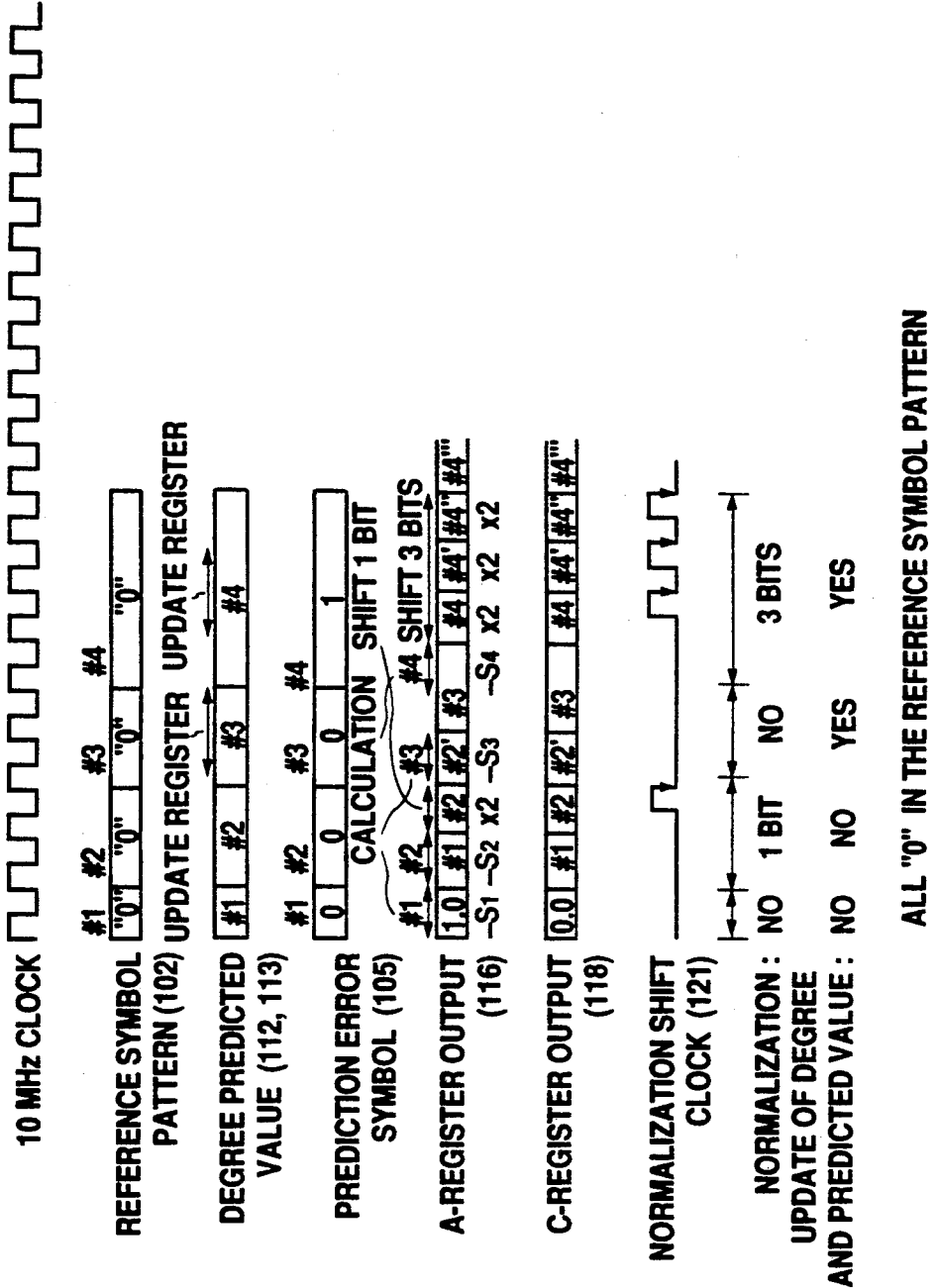
FIG. 4 is a timing chart of another example of the operation of the encoding device shown in FIG. 1.

FIGS. 3 and 4 are timing charts of examples of the operation of this embodiment. In order to make the explanation easy to understand, the case in which all the pixels of the reference symbol pattern 102 are "0" and the case in which not all the pixels of the reference symbol pattern 102 are "0" will be explained separately.

In the case in which not all the pixels of the reference symbol pattern 102 are "0", as shown in FIG. 3, when th encoding symbol is input to the encoding device as the information source symbol 101, the reference symbol pattern 102 of the twelve pixels which have already been processed by the reference symbol generator 1, as shown in FIG. 26, is output, and the detector 7 detects that not all the pixels are "0". The selector 9 receives the detection signal 111 from the detector 7 and outputs the predicted value 113 in the reference symbol pattern, which is read out of the order and predicted value memory 2, to the prediction converter 3 and the order 112 of the predicted value 113 to the region width table 4, respectively. In this embodiment, the access time of the order and predicted value memory 2 is 200 nsec, which corresponds to two periods of a system clock of 10 MHz.

The order signal 112 is converted to the region width signal 106 shown in FIG. 28 by the region width table 4. The exclusive OR of a predicted value signal 113 and the current information source symbol 101 is calculated by the prediction converter 3, which is an EX-OR gate, and the prediction error symbol 105 is output. Thereafter, the effective region $A_i$ and the coordinate $C_i$ of the lower boundary thereof are calculated and the order and the predicted value of the order and predicted value memory 2 are updated as follows.

(1) When there is neither renormalization nor update of the order and the predicted value (when the encoding symbol is #1 in FIG. 3), the calculations of the effective region $A_i$ and the coordinate $C_i$ of the lower boundary are executed in one system clock period.

(2) When there is renormalization but there is no update of the order and the predicted value (when the symbol being encoded is #2 in FIG. 3), the calculations of the effective region $A_i$ and the coordinate $C_i$ of the lower boundary except normalization are executed in one system clock period and the renormalization is executed in m clocks (when the renormalization requires a multiplier of $2^m$).

(3) When there is no renormalization but there is update of the order and the predicted value (when the encoding symbol is #3 in FIG. 3), the calculations of the effective region $A_i$ and the coordinate $C_i$ of the lower boundary are executed in one system clock period and thereafter the contents of the order and predicted value memory 2 are updated in two system clock periods.

(4) When there are both renormalization and update of the degree and the predicted value (when the encoding symbol is #4 in FIG. 3), after the calculations of the effective region $A_i$ and the coordinate $C_i$ of the lower boundary except renormalization are executed in one system clock period, renormalization is executed in m clocks (when the renormalization requires a multiplier of $2^m$). The update of the order and the predicted value is executed in parallel with the renormalization. The processing of the next encoding symbol is executed after both the renormalization and the update of the contents of the order and predicted value memory 2 are finished.

The calculations of the effective region $A_i$ and the coordinate $C_i$ of the lower boundary including the judgment of the prediction error signal (LPS or MPS) are controlled by the timing controller 5f of the arithmetic coder 5 on the basis of the prediction error symbol 105 and an MSB signal 116 output from the A-register 5a. The update of the contents of the order and predicted value memory 2 is controlled by the order and predicted value controller 6.

In the sign register 5e, the carrying operation is executed in parallel with the calculations of the effective region $A_i$ and the coordinate $C_i$ of the lower boundary except renormalization. At the time of renormalization, the carry output of the eighth and subsequent bits is output as a code bit stream in accordance with the shifting operation of the internal register. When all the eight bits of the internal register are "1", a bit stuff signal 122 is supplied to the timing controller 5f. The timing controller 5f suspends a renormalization shift clock 121 and shifts 1 bit (an LSB shift in signal "0" is output) in the internal register in one system clock period.

The operation in the case in which all the pixels of the reference symbol pattern 102 are "0" is shown in FIG. 4. In this case, the outputs of the order and predicted value register 8 are selected by the selector 9 as the order signal 112 in place of the outputs of the order and predicted value memory 2. This processing is characteristic of this embodiment. Since it is only a delay (not more than 10 nsec) in the selector 9 that must be taken into consideration in this processing, a special cycle for reading the order and the predicted value is obviated. In addition, one system clock cycle is enough for the update of the order and the predicted value.

In the above, the case in which all the pixels of the reference symbol pattern 102 are "0" and the case in which not all the pixels in the reference symbol pattern 102 are "0" are explained separately from each other, but both cases are included in the actual encoding of a picture signal. Therefore, the operation timing for the encoding device of this embodiment is a combination of the timings for the respective cases shown in FIGS. 3 and 4.

As is clear from the above explanation, the encoding processing time T is expressed by the following formula:

$$T = 200 * Na + 100 * (Na + Nb) + 100 * Nc + 100 * a$$
$$(nsec)$$

wherein Na represents the number of symbols when not all the pixels in the reference symbol pattern is "0", Nb the number of symbols when all the pixels in the reference symbol pattern is "0", Nc the number of code bits, and a the number of clocks required to be added when the updating processing is not finished by the end of the renormalization processing, or the number of clocks required for the update of the order and the predicted value when there is no renormalization processing.

The encoding processing time required for encoding the picture information in an A4-size copy in a standard facsimile equipment at a resolution of 8 horizontal pixels/mm and 7.7 vertical lines/mm will now be calculated. If it is assumed that the ratio of the case in which all the pixels of the reference symbol pattern is "0" is ⅔ and the compression ratio is 30, $$Na = 1728 * 2376 * (\tfrac{1}{3})$$

$$Nb = 1728 * 2376 * (\tfrac{2}{3})$$

$$Nc = 1728 * 2376 * (1/30).$$

The encoding processing time T is about 0.7 sec. In this case, since the number of symbols required to update the orders and the predicted values is between about 1/50 and 1/200 of all the symbols, the influence of a is negligible.

In contrast, in a conventional encoding device, $$Na = 1728 * 2376$$

$$Nb = 0$$

$$Nc = 1728 * 2376 * (1/30).$$

The encoding processing time T is about 1.25 sec. it will be understood that the encoding processing speed is greatly increased in the present invention.

Embodiment 2

Figure 5:
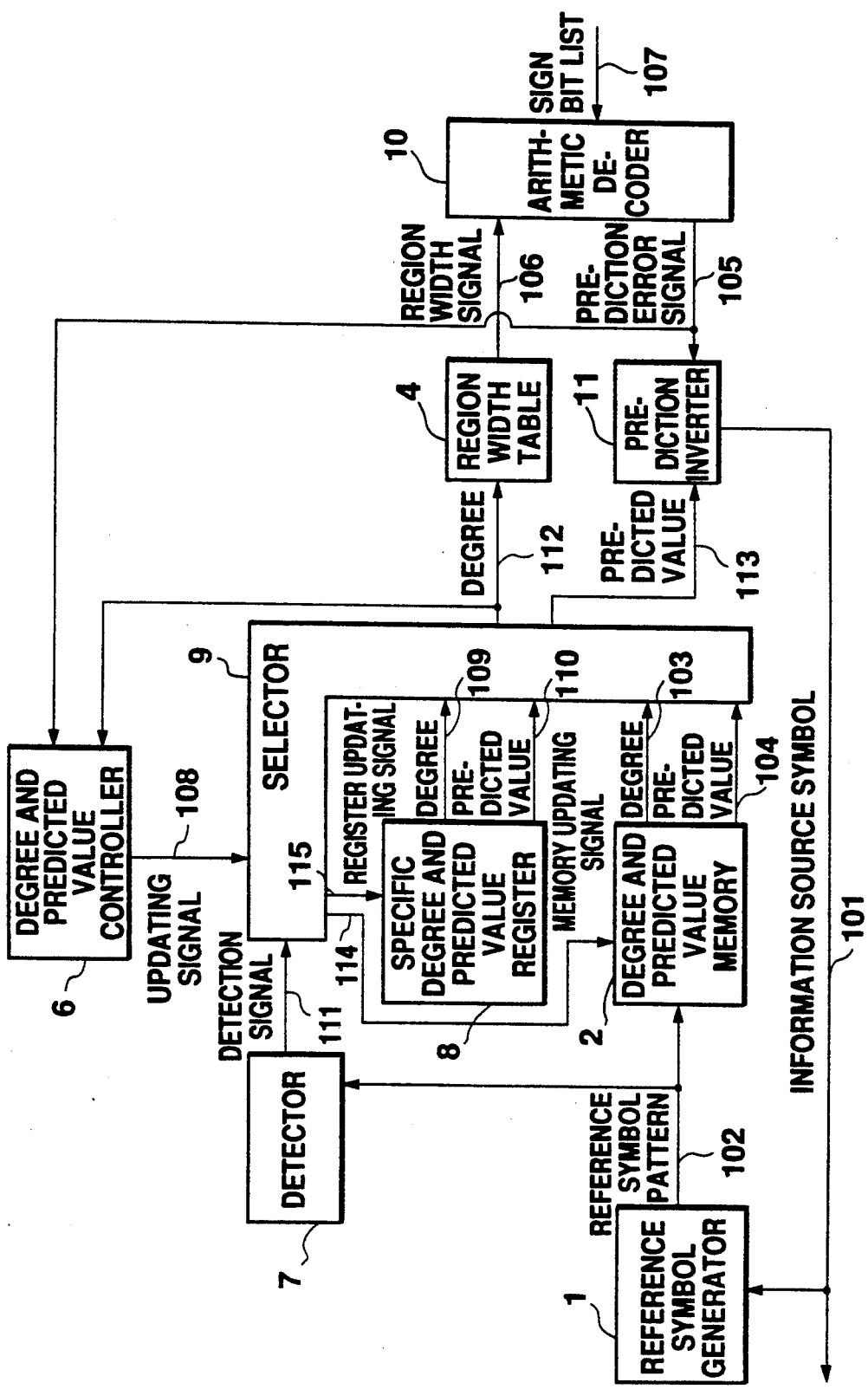
FIG. 5 is a block diagram of the structure of an embodiment of a decoding device according to a second aspect of the present invention.

FIG. 5 is a block diagram of an embodiment of a decoding device according to a second aspect of the present invention. This embodiment is a decoding device for decoding a code bit stream encoded by the encoding device according to the first aspect of the present invention. In FIG. 5, an arithmetic decoder 10 reproduces the prediction error symbol 105 from the code bit stream on the basis of the region width signal 106. A prediction inverter 11 reproduces the information source symbol 101 by the exclusive-OR operation of the prediction error symbol 105 and the predicted value 113. The other portions are the same as in the embodiment shown in FIG. 1.

Figure 6:
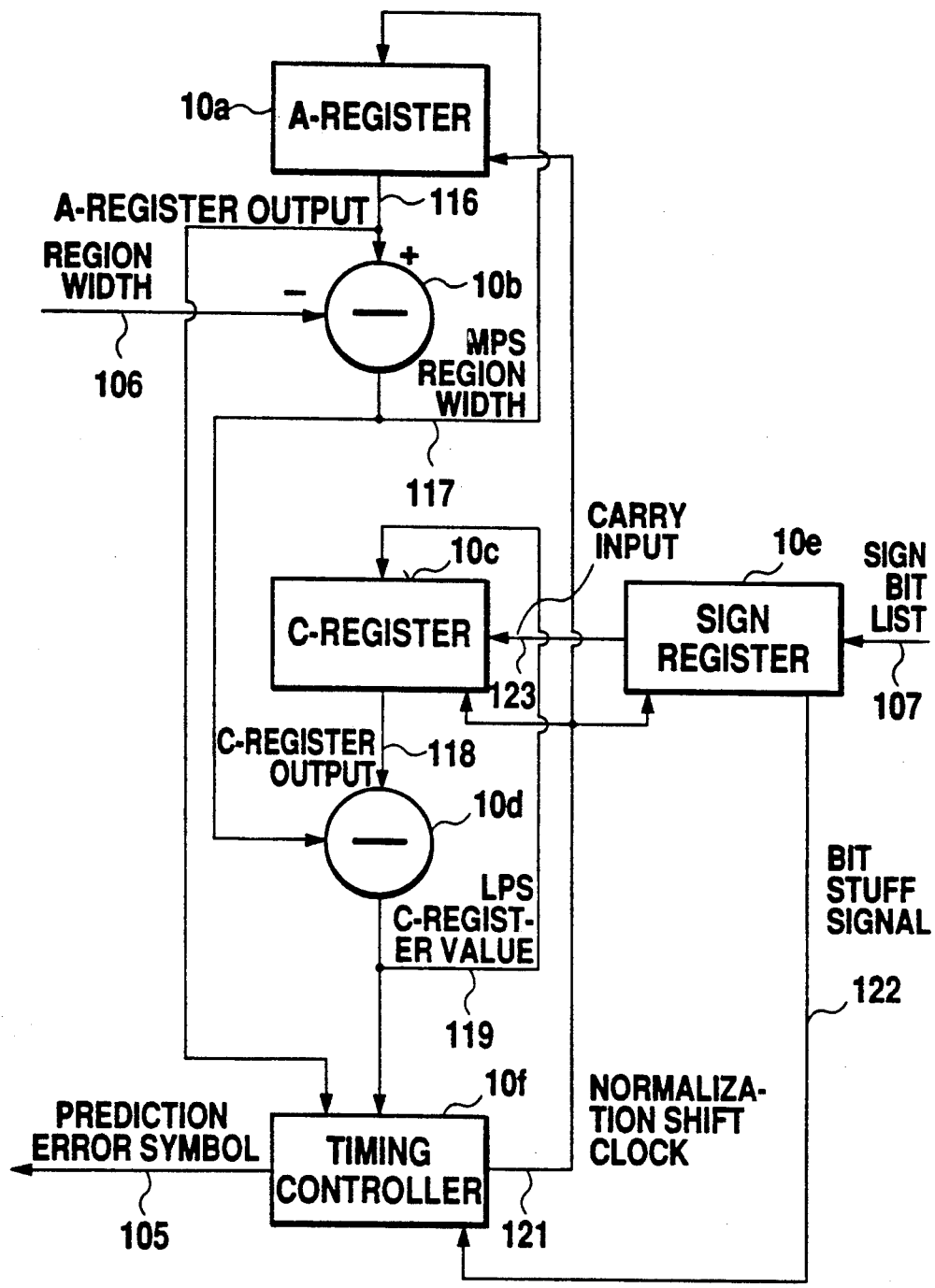
FIG. 6 is a block diagram of the internal structure of an arithmetic decoder in the decoding device shown in FIG. 5.

FIG. 6 is a block diagram of the internal structure of the arithmetic decoder. An A-register 10a stores the effective region $A_i$ on the number line. A subtracter 10b calculates the MPS region width 117 and a C-register 10c stores the coordinate of the lower bound thereof. A subtracter 10d calculates the C-register value 119 in the case of an LPS. A code register 10e temporarily stores the code bit stream and supplies the first zone bit signal of the 9-bit internal register to the C-register 10c in accordance with the renormalization shift clock 121. When the 8-bits stored in the sign register 10e are eight consecutive "1"s, the code register 10e inputs 1 bit from the code bit stream so as to execute addition at the last bit of the internal 9-bit register, thereby eliminating the bit stuff signal inserted by the arithmetic coder 5 shown in FIG. 1. The operation of the arithmetic decoder 10 is controlled by a timing controller 10f.

The operation of this embodiment will now be explained.

An arithmetic code is decoded by the following operation. In the following, it is assumed that the relative coordinate, which is the content of the C-register 10c is $C_i$ and the region width of the LPS at the point of the i-th prediction error symbol $a_i$ is S.

If $C_{i-1} < (A_{i-1} - S)$, $a_i$ is an MPS, and so $A_i$ and $C_i$ are updated as follows:

$$A_i = A_{i-1} - S$$

$$C_i = C_{i-1}$$

If $C_{i-1} \geq (A_{i-1} - S)$, $a_i$ is an LPS, and $A_i$ and $C_i$ are updated as follows:

$$A_i = S$$

$$C_i = C_{i-1} + (A_{i-1} - S).$$

When the effective region $A_i$ is not more than ½, $A_i$ is multiplied by an m-th power of 2 as a renormalization operation in order to enhance the accuracy. At this time, a carry input signal 123 output from the code register 10e is input to the C-register 10c from the last bit of Ci. By this operation, $A_i$ and $C_i$ are updated as follows:

Updated $A_i = A_i * 2^m$ (½ < updated $A_i \leq 1$)

Updated $C_i = C_i * 2^m$

Figure 7:
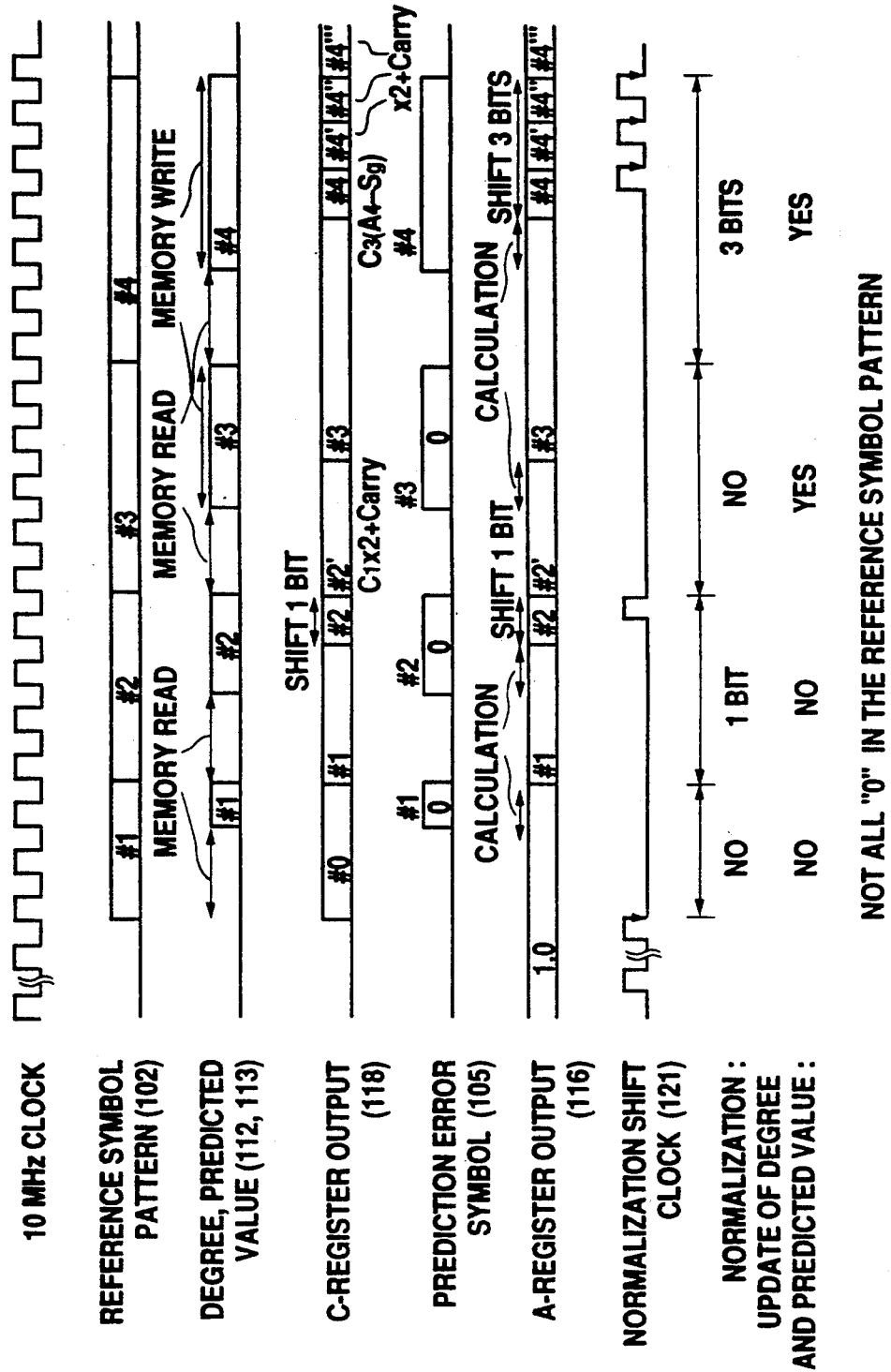
FIG. 7 is a timing chart of an example of the operation of the decoding device shown in FIG. 5.
Figure 8:
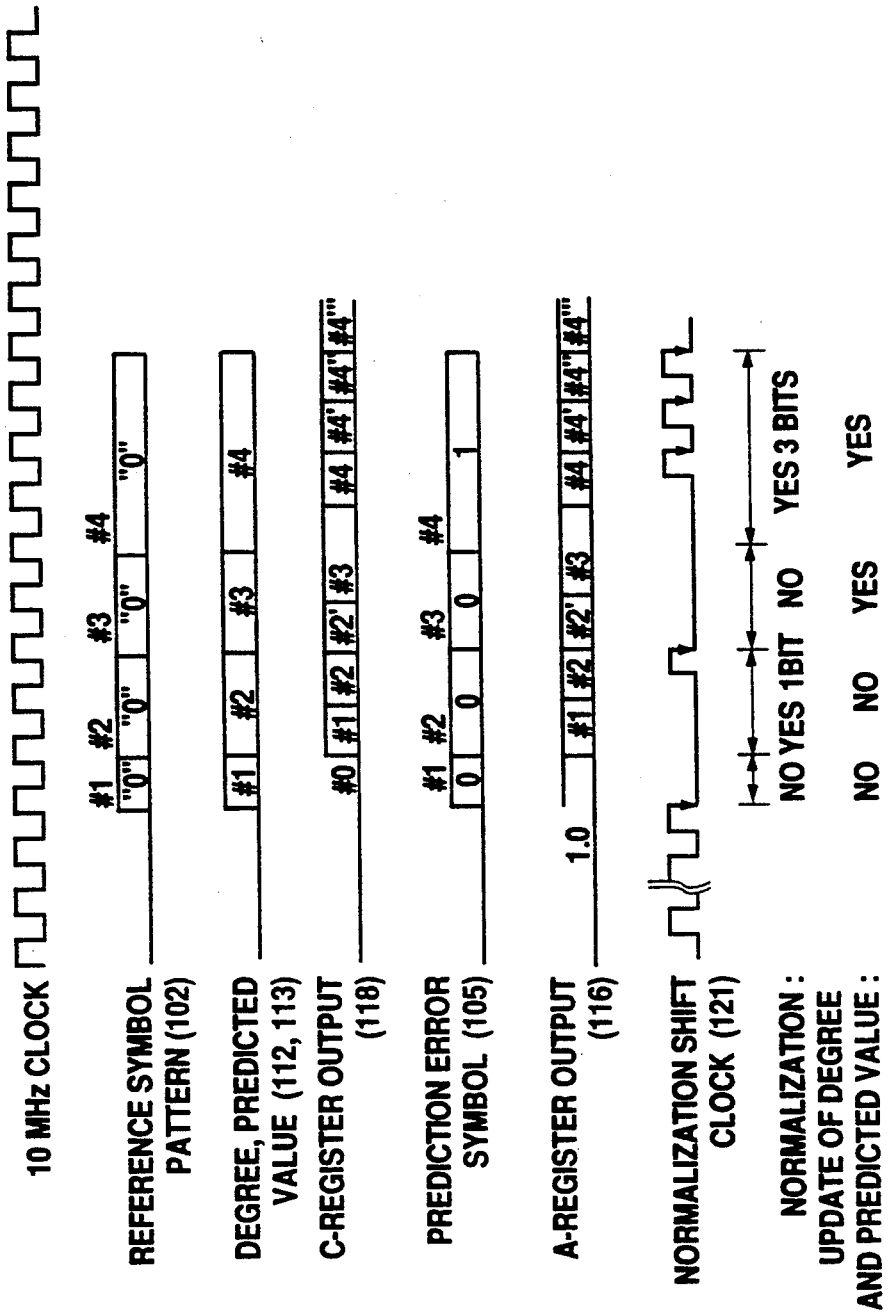
FIG. 8 is a timing chart of another example of the operation of the decoding device shown in FIG. 5.

FIGS. 7 and 8 are timing charts of examples of the operation of this embodiment. FIG. 7 shows a timing chart in the case in which all the pixels of the reference symbol pattern 102 are "0", and FIG. 9 a timing chart in the case in which not all the pixels of the reference symbol pattern 102 are "0".

The generation of the reference symbol pattern 102 and the update of the order and the predicted value are the same as in the embodiment shown in FIG. 1.

In producing the prediction error symbol $a_i$ and calculating the effect region $A_i$ and the relative coordinate $C_i$, $C_{i-1}$ and $(A_{i-1}-S)$ are first compare by the timing controller 10f so as to determine whether the symbol $a_i$ is an MPS or an LPS. On the basis of the result of the comparison, $A_i$ and $C_i$ are calculated and the results are stored in the A-register 10a and the C-register 10c, respectively. This series of processing is carried out in one system clock period.

When the effective region $A_i$ is less than $\frac{1}{2}$ as a result of the calculation, the renormalization processing is carried out in m clocks (when the renormalization requires a multiplier of $2^m$), as described above. At this time, when the 8 bits stored in the sign register 10e are eight consecutive "1"s, the renormalization shift clock 121 is suspended and the code register 10e inputs 1 bit from the code bit stream so as to execute addition at the last bit of the internal 9-bit register.

The decoding processing time T is expressed by the following formula in the same way as the encoding processing time:

$$T = 200 * Na + 100 * (Na + Nb) + 100 * Nc + 100 * a$$
$$(nsec)$$

Thus, a great increase in processing speed is also realized by this embodiment in comparison with a conventional decoding device.

Although a special register is provided for the purpose of increasing the processing speed only in the case in which all the pixels of the reference symbol pattern 102 are "0" in this embodiment, a plurality of special registers may be further provided including a special register for the case in which all the pixels of the reference symbol pattern 102 are "1".

Embodiment 3.1

Figure 9:
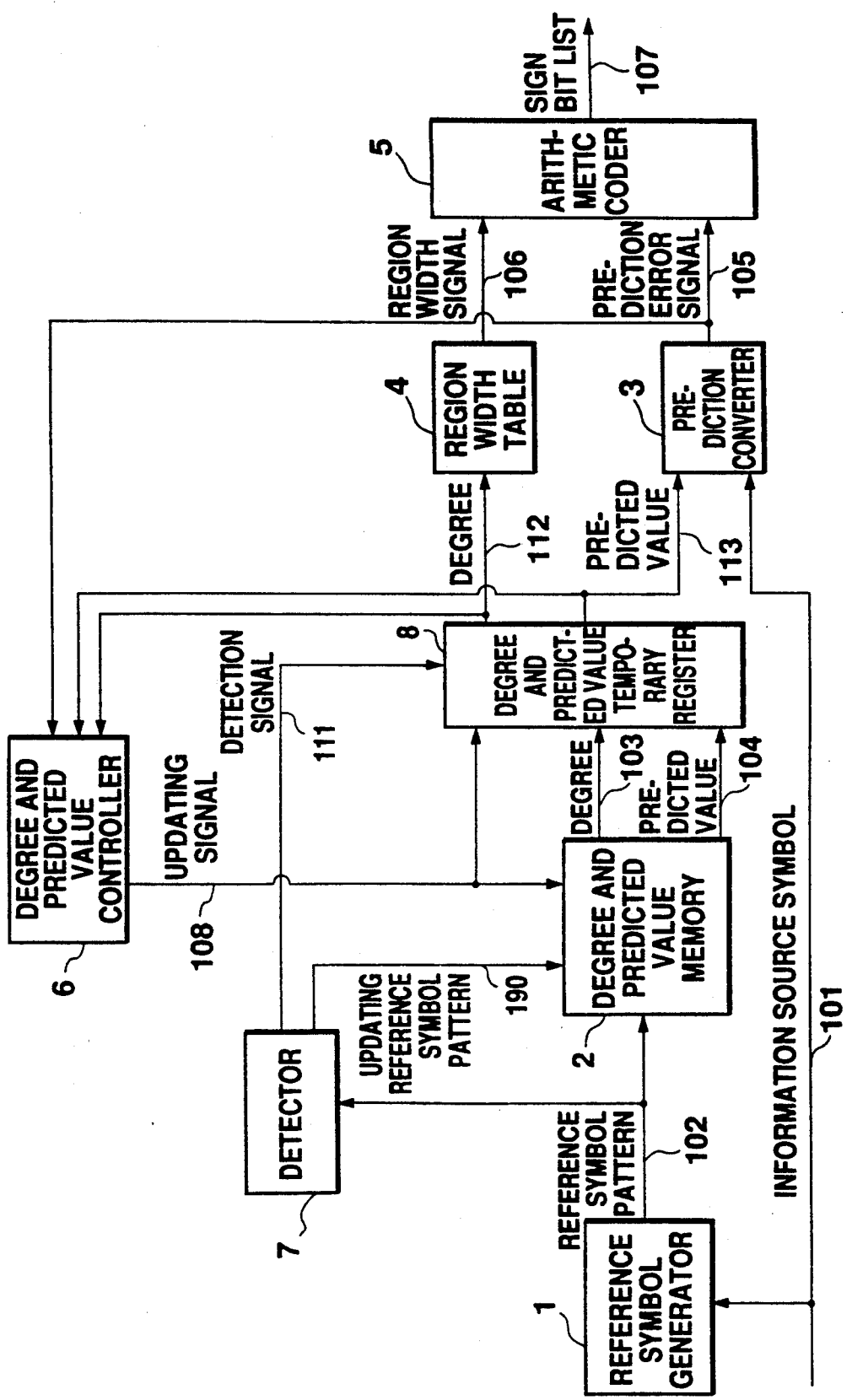
FIG. 9 is a block diagram of the structure of an embodiment of an encoding device according to a third aspect of the present invention.

FIG. 9 shows an embodiment of an encoding device according to a third aspect of the present invention. A characteristic of the encoding device shown in FIG. 9 as compared with the conventional encoding device shown in FIG. 25 is that the detector 7 monitors the reference symbol pattern 102 output from the reference symbol generator 1 and judges whether or not the reference symbol pattern for the encoding symbol is coincident with the reference symbol pattern for the symbol which was the object of the preceding encoding operation. Another characteristic is that an order and predicted value temporary register 8 for temporarily storing the order 103 and the predicted value 104 output from the order and predicted value memory 2 is provided. The order and predicted value temporary register 8 also temporarily stores, if necessary, an updating signal 108 output from the order and predicted value controller 6. The output signal of the order and predicted value temporary register 8 is input to the region width table 4 and the prediction converter 3.

Figure 10:
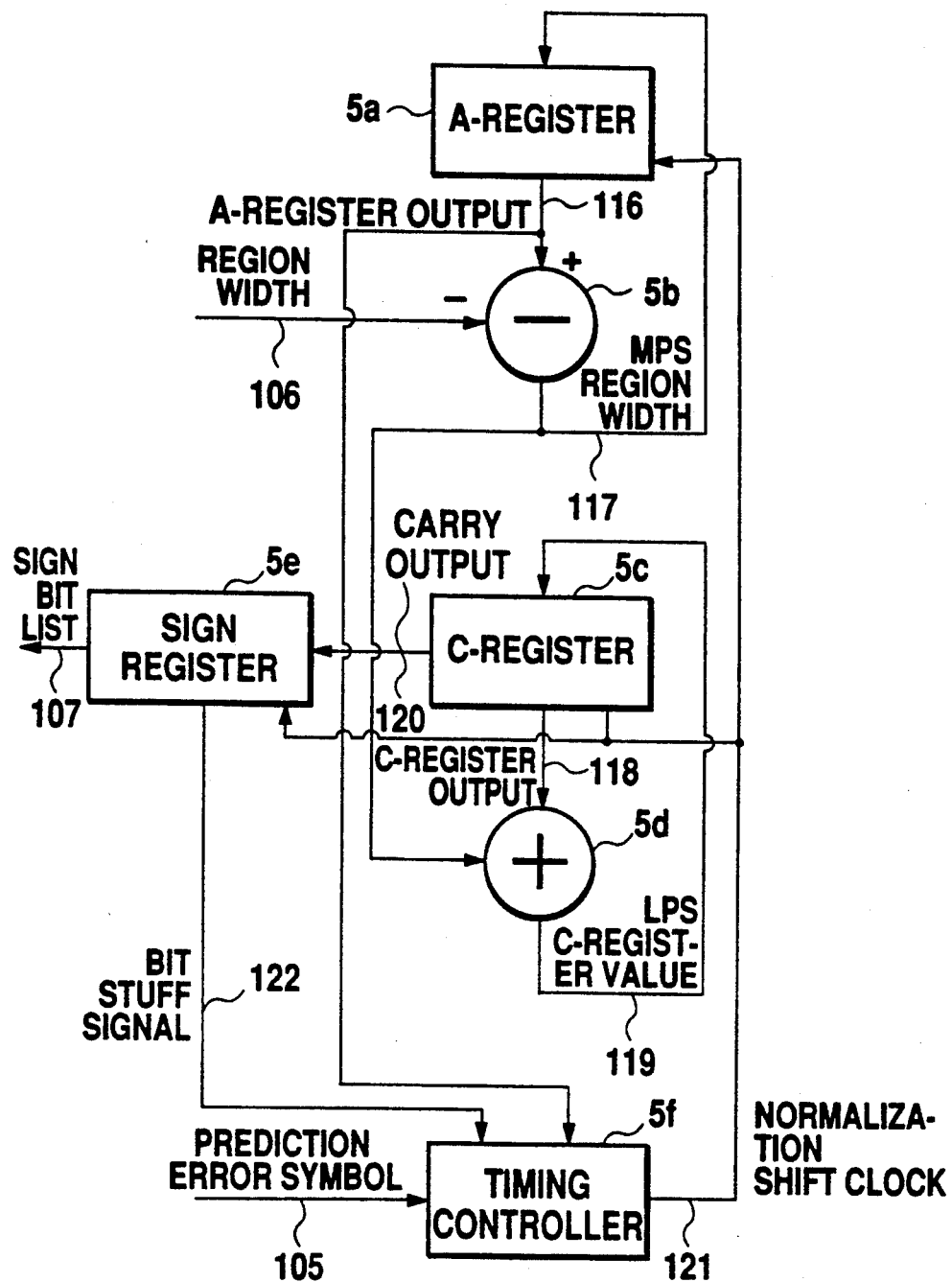
FIG. 10 is a block diagram of the internal structure of an arithmetic coder in the encoding device shown in FIG. 9.

FIG. 10 is a block diagram of the internal structure of the arithmetic coder 5. In FIG. 10, the A-register 5a stores the effective region $A_i$ on the number line, and the subtracter 5b calculates the MPS region width 117. The C-register 5c stores the coordinate 115 of the lower boundary. The adder 5d calculates the C-register value 119 in the case of an LPS. The code register 5e temporarily stores the carry output 120, which is an overflow (shift out) signal of the C-register 5c, and executes a carrying operation at the time of updating the C-register 5c. When the contents of the code bits stored in the code register 5e are eight consecutive "1"s, the code register 5e inserts "0" from below the last bit so that the influence of the subsequent carrying operation is limited to the inserted "0" or subsequent bits (this processing will be referred to as "bit stuff processing" hereinunder in the same way as in Embodiment 1). The timing controller 5f controls the operation of the arithmetic coder 5.

The operation of this embodiment will now be explained.

Figure 11:
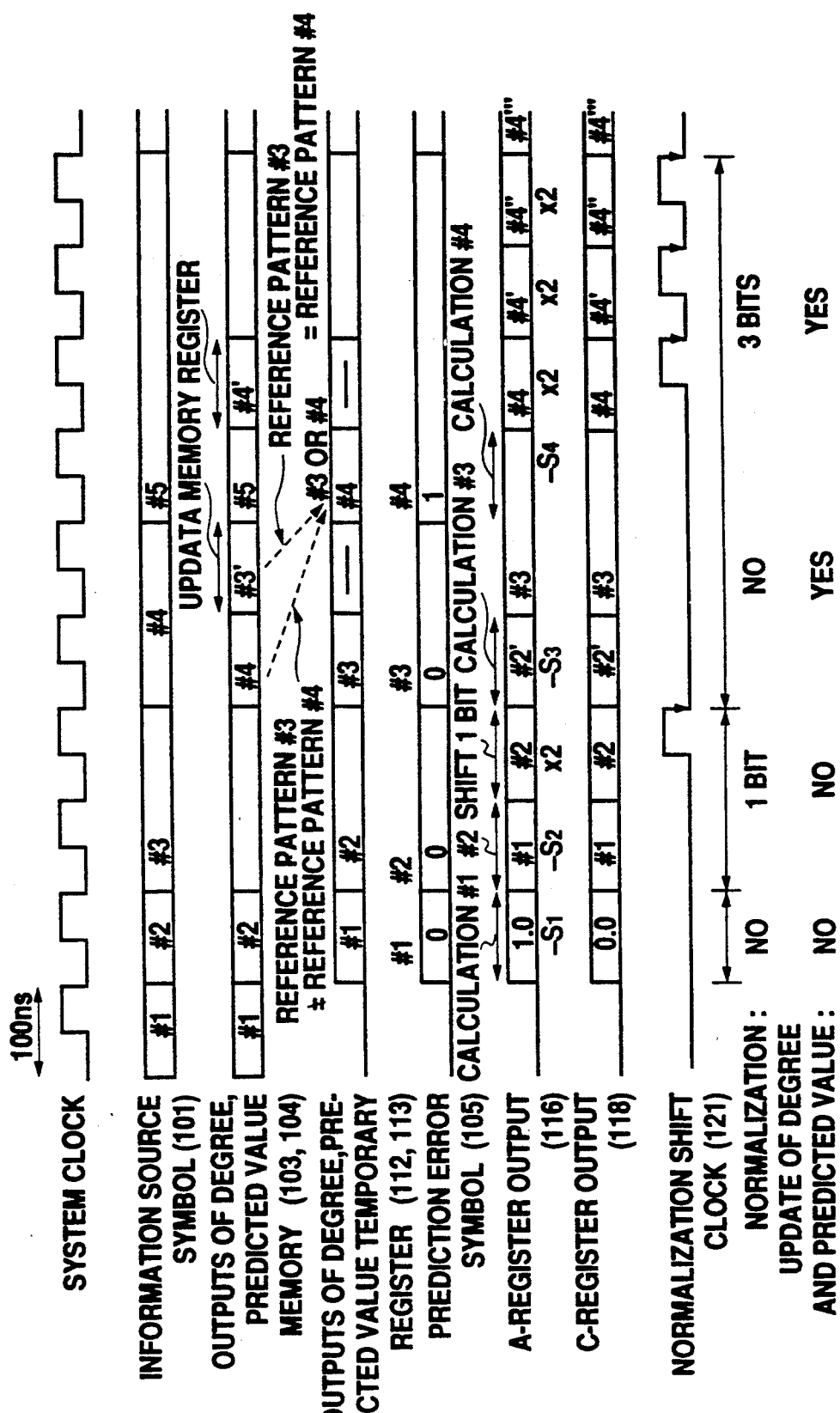
FIG. 11 is a timing chart of an example of the operation of the encoding device shown in FIG. 9.

FIG. 11 is a timing chart of an example of the operation of this embodiment. When the encoding symbol is input to the encoding device as the information source symbol 101, the reference symbol pattern 102 of the twelve pixels which have already been processed by the reference symbol generator 1, as shown in FIG. 26, is output. The order and the predicted value in the reference symbol pattern are read out of the order and predicted value memory 2 and stored in the order and predicted value temporary register 8.

The processing from the generation of the reference symbol pattern to the storage of the order and the predicted value in the order and predicted value temporary register 8 is carried out in 100 nsec, which corresponds to one period of a 10 MHz system clock.

The order signal 112 output from the order and predicted value temporary register 8 is converted into the region width signal 106 shown in FIG. 28 by the region width table 4. The exclusive OR of the predicted value signal 113 output from the order and predicted value temporary register 8 and the current information source symbol 101 is obtained by the prediction converter 3, which is an EX-OR gate, so that the prediction error symbol 105 is generated. Thereafter, the effective region $A_i$ and the coordinate $C_i$ of the lower boundary are calculated and the order and the predicted value are updated as follows.

(1) When there is neither renormalization nor update of the order and the predicted value (when the encoding symbol is #1 in FIG. 11), the calculations of the effective region $A_i$ and the coordinate $C_i$ of the lower boundary are executed in one system clock period.

(2) When there is renormalization but there is no update of the order and the predicted value (when the encoding symbol is #2 in FIG. 11), the calculations of the effective region $A_i$ and the coordinate $C_i$ of the lower boundary except renormalization are executed in one system clock period and the renormalization is executed in m clocks (when the renormalization requires a multiplier of $2^m$).

(3) When there is no renormalization but there is update of the order and the predicted value (when the encoding symbol is #3 in FIG. 11), the calculations of the effective region $A_i$ and the coordinate $C_i$ of the lower boundary are executed in one system clock period and thereafter the contents of the order and predicted value memory 2 are updated in two system clock periods.

(4) When there are both renormalization and update of the degree and the predicted value (when the encoding symbol is #4 in FIG. 11), after the calculations of the effective region $A_i$ and the coordinate $C_i$ of the lower boundary except renormalization executed in one system clock period, renormalization is executed in m clocks (when the renormalization requires a multiplier of $2^m$). The update of the order and the predicted value is executed in parallel with the renormalization. The processing of the next symbol being encoded is executed after both the renormalization and the update of the contents of the order and predicted value memory 2 are finished.

The calculations of the effective region $A_i$ and the coordinate $C_i$ of the lower boundary including the judgment of the prediction error signal (LPS or MPS) are controlled by the timing controller 5f of the arithmetic coder 5 on the basis of the prediction error symbol 105 and the MSB signal 116 output from the A-register 5a. The update of the contents of the degree and predicted value memory 2 is controlled by the degree and predicted value controller 6.

In the code register 5e, the carrying operation is executed in parallel with the calculations of the effective region $A_i$ and the coordinate $C_i$ of the lower boundary except renormalization. At the time of renormalization, the carry output of the eighth and subsequent bits is output as a code bit stream in accordance with the shifting operation of the internal register. When all the 8 bits of the internal register are "1", a bit stuff signal 122 is supplied to the timing controller 5f. The timing controller 5f suspends a renormalization shift clock 121 and shifts 1 bit (an LSB shift in signal "0" is output) in the internal register in one system clock period.

The operation of reading the order and the predicted value from the order and predicted value memory 2 and the calculations of the effective region $A_i$ and the coordinate $C_i$ of the lower boundary are conventionally processed serially because there is a possibility of updating the order and the predicted value thereafter. In contrast, in the present invention, since parallel processing of the calculations of the effective region $A_i$ and the coordinate $C_i$ of the lower boundary for the encoding symbol and the operation of reading the order and the predicted value from the order and predicted value memory 2 for the symbol which is the object of the next encoding operation is possible, a great increase in processing speed is achieved in comparison with a conventional encoding device.

More specifically, the order and predicted value temporary register 8 is newly provided in this embodiment. When the order signal and the predicted value signal of the encoding symbol are output from the order and predicted value temporary register 8, the order and the predicted value of the symbol which is the object of the next encoding operation are read out of the order and predicted value memory 2 in one system clock period. The subsequent processing is executed as follows.

(1) When there is neither renormalization nor update of the order and the predicted value (when the encoding symbol is #1 in FIG. 11), after the calculations of the effective region $A_i$ and the coordinate $C_i$ of the lower boundary, the calculations of the region and the coordinate of the symbol which is the object of the next encoding operation are executed.

(2) When there is renormalization but there is no update of the order and the predicted value (when the encoding symbol is #2 in FIG. 11), after the end of renormalization, the calculations of the effective region $A_i$ and the coordinate $C_i$ of the lower boundary of the symbol which is the object of the next encoding operation are executed.

(3) When there is no renormalization but there is update of the order and the predicted value (when the encoding symbol is #3 in FIG. 11), the contents of the order and predicted value memory 2 are updated on the basis of an updating reference symbol pattern 190 for the encoding symbol and the updating signal 108 output from the order and predicted value controller 6. The updating reference symbol pattern 190 is generated by delaying the reference symbol pattern 102 by one symbol and is output from the detector 7. When the reference symbol patter 102 (signal for the symbol which is the object of the next encoding operation) is coincident with the updating reference symbol pattern 190 for the encoding symbol, the contents of the order and predicted value temporary register 8 are updated on the basis of the detection signal 111. The update of the content is processed in one system clock period, and thereafter the calculations of the region and the coordinate of the symbol which is the object of the next encoding operation are executed.

(4) When there are both renormalization and update of the order and the predicted value (when the encoding symbol is #4 in FIG. 11), the order and the predicted value are updated in the same way as in the case (3), Thereafter and, after the end of renormalization, the calculations of the region and the coordinate except renormalization are executed.

As is clear from the above explanation, the encoding processing time T is expressed by the following formula:

$$T = 100 + 100 * Na + 100 * Nc + 100 * a \ (nsec)$$

wherein Na represents the number of symbols, Nc the number of code bits, and a the number of clocks required for the update of the order and the predicted value in the case (3).

The encoding processing time required for encoding the picture information in an A4 size copy in a standard facsimile equipment at a resolution of 8 horizontal pixels/mm and 7.7 vertical lines/mm will now be calculated. If it is assumed that the compression ratio is 30, $$Na = 1728 * 2376$$

$$Nc = 1728 * 2376 * (1/30).$$

The encoding processing time T is about 0.4 sec. In this case, since the number of symbols required to update the orders and the predicted values is between about 1/50 and 1/200 of all the symbols, and the case (3) is limited to the case in which the result of prediction is an MPS and there is no renormalization, the influence of a is negligible.

In contrast, in a conventional encoding device, $$T = (100 + 100) * Na + 100 * Nc + 100 * a \ (nsec)$$

When the encoding processing time T is calculated under the same conditions, T is about 0.8 sec. It will be understood that the encoding processing speed is greatly increased in the present invention.

Embodiment 3.2

Figure 12:
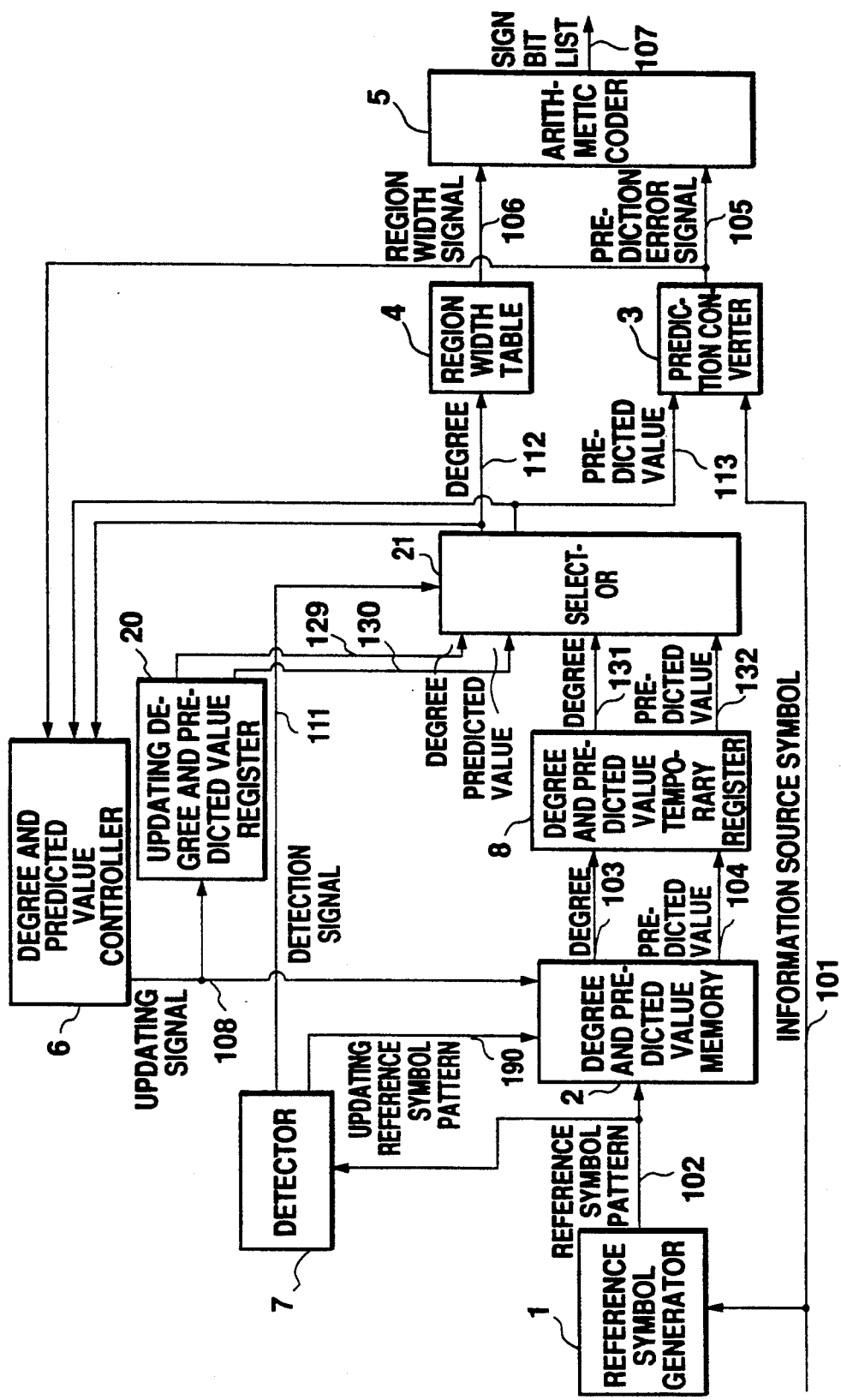
FIG. 12 is a block diagram of the structure of another embodiment of an encoding device according to the third aspect of the present invention.

FIG. 12 shows another embodiment of an encoding device according to a third aspect of the present invention. A characteristic of this embodiment is that an updating order and predicted value register 2 is provided. Another characteristic is that a selector 21 for choosing between the outputs of the order and predicted value temporary register 8 for storing the signal read out of the order and predicted value memory 2 and the outputs of the updating order and predicted value register 20 is provided.

In this embodiment, the order and predicted value temporary register 8 stores only the signal read out of the order and predicted value memory 2, and the updating order and predicted value register 20 store the order and the predicted value after adaptive processing (the updated values when they are updated, and the output values of the selector 21 when they are not updated). If the detector 7 detects that the reference symbol pattern for the encoding symbol is coincident with the reference symbol pattern for the symbol which was the object of the preceding encoding operation, the output of the updating order and predicted value register 20 is selected by the selector 21 in accordance with the detection signal 111. On the other hand, when the reference symbol pattern for the encoding symbol is different from the reference symbol pattern for the symbol which was the object of the preceding encoding operation, the output of the order and predicted value temporary register 8 is selected, and the region width is calculated and the prediction is converted on the basis of this output. The other processing is the same as in the embodiment shown in FIG. 9.

However, the detection signal 111 from the detector 7 is delayed by one symbol in comparison with the embodiment shown in FIG. 9.

Embodiment 4.1

Figure 13:
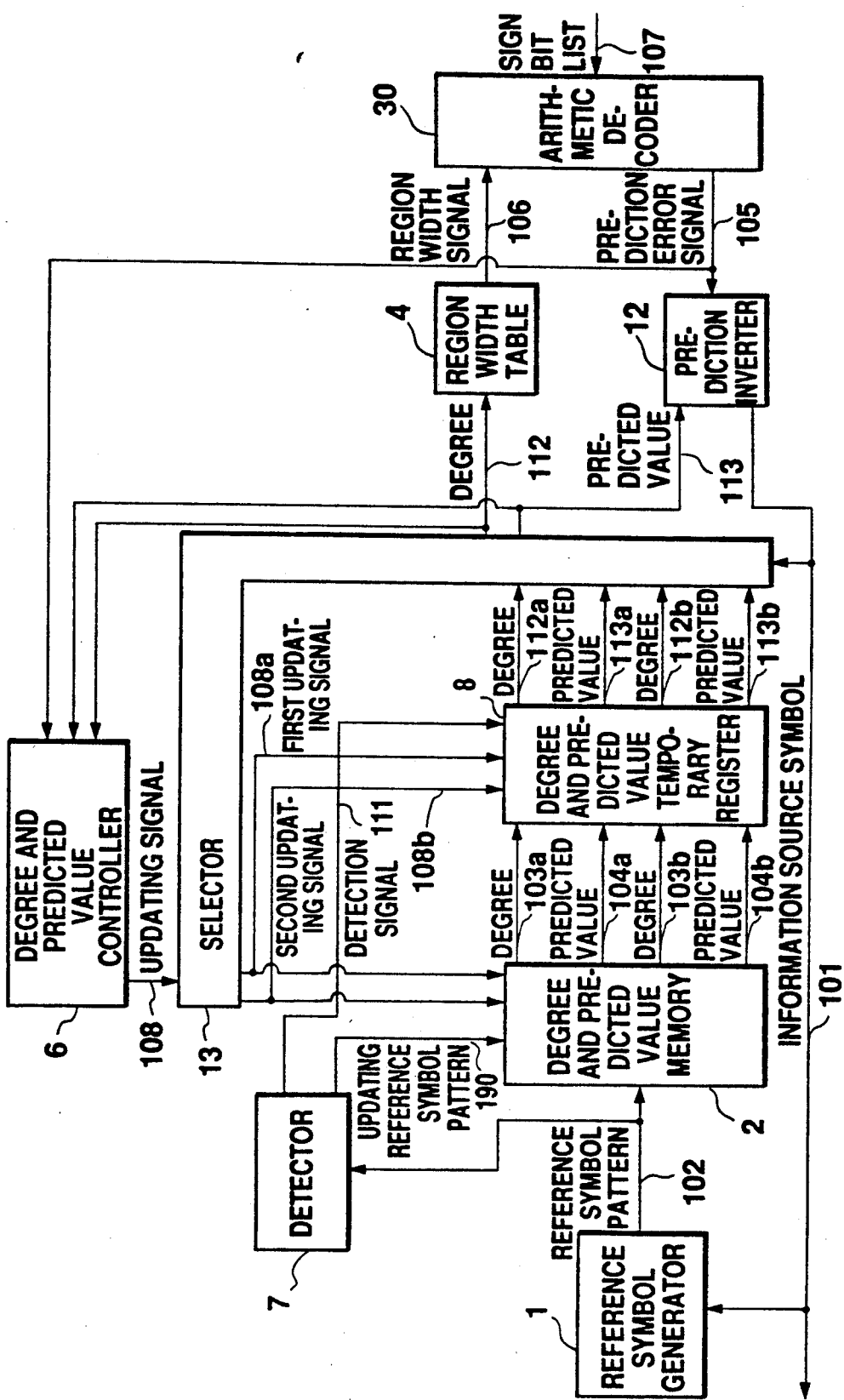
FIG. 13 is a block diagram of the structure of an embodiment of a decoding device according to a fourth aspect of the present invention.

FIG. 13 is a block diagram of an embodiment of a decoding device according to a fourth aspect of the present invention. In FIG. 13, an arithmetic decoder 30 reproduces the prediction error symbol 105 from the code bit stream on the basis of the region width signal 106. A prediction inverter 12, which is an EX OR gate, reproduces the information source symbol 101 by the exclusive-OR operation of the prediction error symbol 105 and the predicted value 113. The order and predicted value memory 2 inputs the reference symbol pattern of the eleven pixels other than the reference pixel A shown in FIG. 26, and outputs two pairs of order and predicted value signals 103a, 104a and 103b, 104b for the pixel A in the state of "1" and the pixel A in the state of "0", respectively. The order and predicted value temporary register 8 receives and stores two pairs of orders and predicted values. A selector 13 selects either pair of orders and predicted value in accordance with the preceding information source symbol 101 reproduced by the prediction inverter 12. When the selector 13 receives the updating signal 108 from the order and predicted value controller 6, the selector 13 outputs either a first updating signal 108a or a second updating signal 108b for updating the signals 103a, 104a, or the signals 103b, 104b in the degree and predicted value memory 2 and the signals 112a, 113a or 112b, 113b in the order and predicted value temporary register 8 in accordance with the reproduced information source symbol 101, namely, depending upon whether the reference pixel A in FIG. 26 is "1" or "0". The other portions are the same as in the embodiment shown in FIG. 1.

Figure 14:
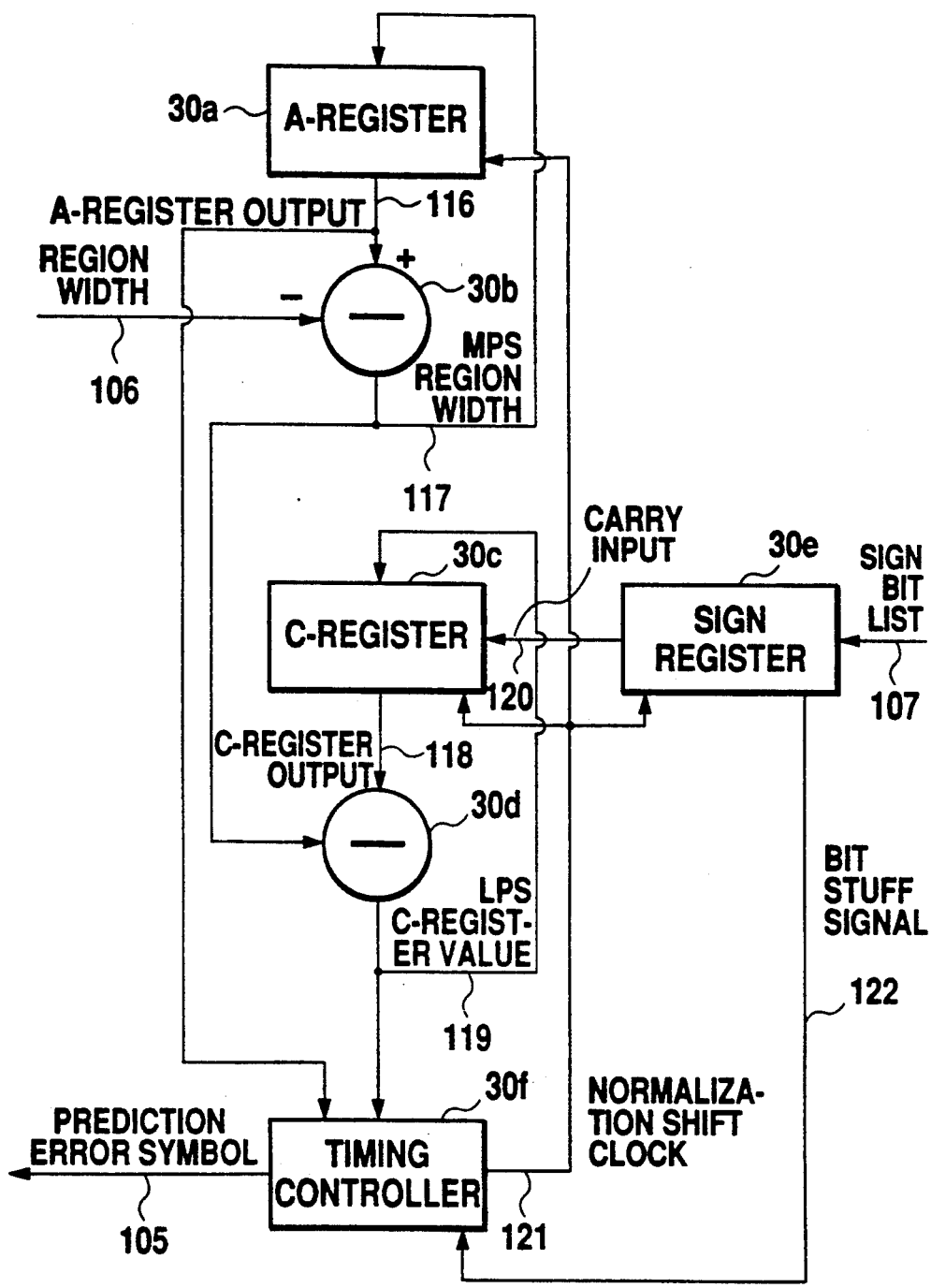
FIG. 14 is a block diagram of the internal structure of an arithmetic decoder in the decoding device shown in FIG. 13.

FIG. 14 is a block diagram of the internal structure of an arithmetic decoder 30. An A-register 30a stores the effective region $A_i$ on the number line. A subtracter 30b calculates the MPS region width 117 and a C-register 30c stores the coordinate of the lower bound thereof. A subtracter 30d calculates the C-register value 119 in the case of an LPS. A code register 30e temporarily stores the code bit stream and supplies the first zone bit signal of the 9-bit internal register to the C-register 30c in accordance with the renormalization shift clock 121. When the 8 bits stored in the code register 30e are eight consecutive "1"s, the code register 30e inputs 1 bit from the code bit stream so as to execute addition at the last bit of the internal 9-bit register, thereby eliminating the bit stuff signal inserted by the arithmetic coder 5 shown in FIG. 12. The operation of the arithmetic decoder 30 is controlled by a timing controller 30f.

The operation of this embodiment will now be explained.

An arithmetic code is decoded by the following operation. In the following, it is assumed that the relative coordinate, which is the content of the C-register 10c is $C_i$ and the region width of the LPS at the point of the i-th prediction error symbol $a_i$ is S.

If $C_{i-1} < (A_{i-1} - S)$, ai is an MPS, and so $A_i$ and $C_i$ are updated as follows:

$$A_i = A_{i-1} - S$$

$$C_i = C_{i-1}.$$

If $C_{i-1} \geq (A_{i-1} - S)$, $a_i$ is an LPS, and $A_i$ and $C_i$ are updated as follows:

$$A_i = S$$

$$C_i = C_{i-1} + (A_{i-1} - S).$$

When the effective region $A_i$ is not more than ½, $A_i$ is multiplied to an m-th power of 2 as a renormalization operation in order to enhance the accuracy. At this time, the carry input signal 123 output from the code register 10e is input to the C-register 30c from the last bit. By this operation, $A_i$ and $C_i$ are updated as follows:

Updated $A_i = A_i^* 2^m$ (½ < updated $A_i$ < 1)

Updated $C_i = C_i^* 2^m$

Figure 15:
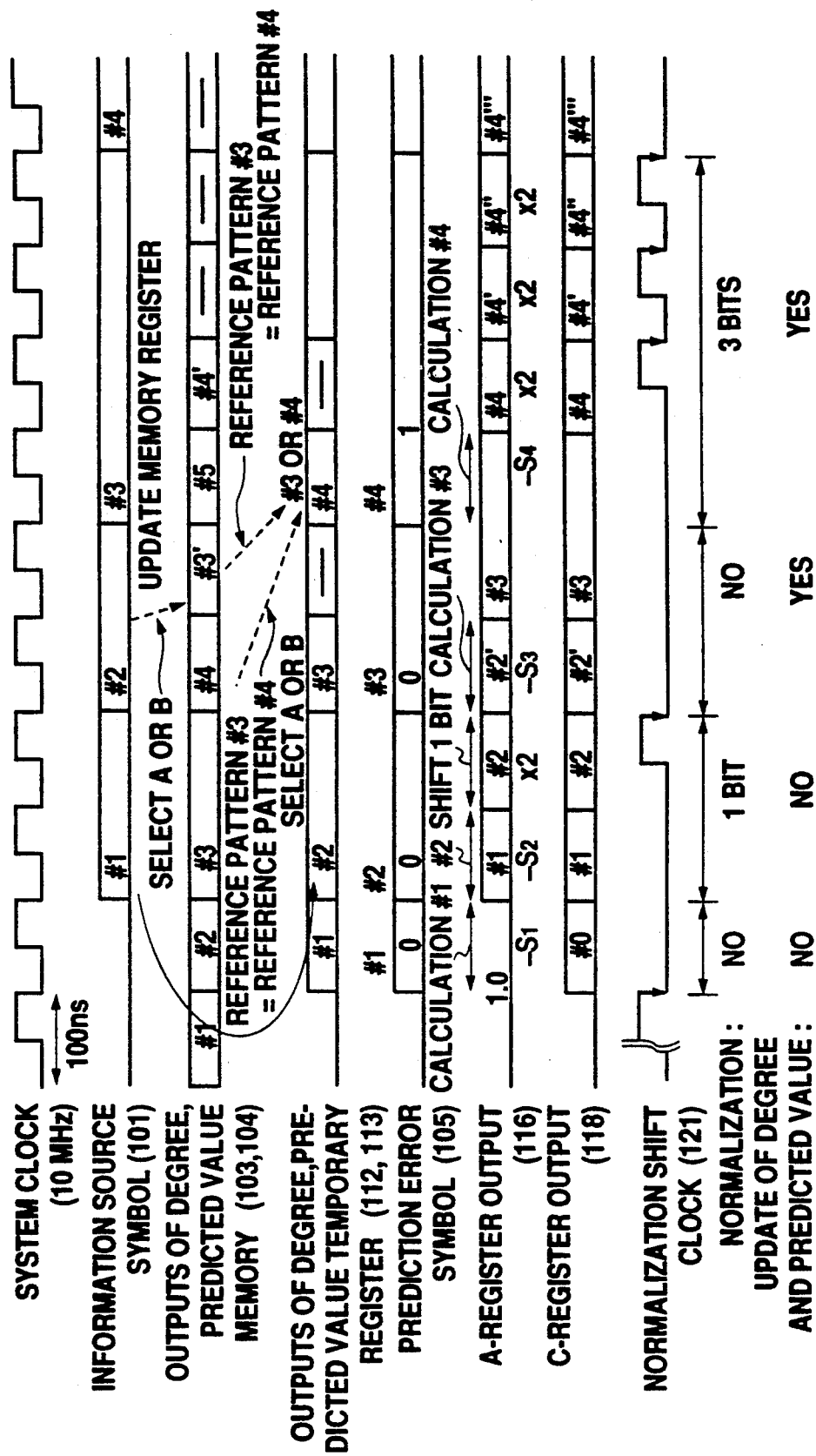
FIG. 15 is a timing chart of an example of the operation of the decoding device shown in FIG. 13.

FIG. 15 is a timing chart of an example of the operation of this embodiment.

Two pairs of order and predicted value signals 103a, 103b and 104a, 104b for the pixel A in the state of "1" and the pixel A in the state of "0", respectively, are read out of the order and predicted value memory 2 on the basis of the reference symbol pattern of the eleven pixels other than the reference pixel A shown in FIG. 26, and are stored in the order and predicted value temporary register 8. These processings are executed in one system clock period. Thereafter, either pair of order and predicted value is selected in accordance with the value of A, which is the preceding information symbol 101 reproduced by the selector 13, and the information source symbol for the symbol being decoded is produced and the order of the predicted value are updated.

In producing the prediction error symbol $a_i$ and calculating the effective region $A_i$ and the relative coordinate $C_i$, $C_{i-1}$ and $(A_{i-1}-S)$ are first compared by the timing controller $30f$ so as to determine whether the symbol al is an MPS or an LPS. On the basis of the result of the comparison, $A_i$ and $C_i$ are calculated as described above and the results are stored in the A-register $30a$ and the C-register $30c$, respectively. This series of processing is carried out in one system clock period.

When the effective region $A_i$ is less than ½ as a result of the calculation, the renormalization processing is carried out in m clocks (when the renormalization requires a multiplier of $2^m$), as described above. At this time, when the 8 bits stored in the code register $30e$ are eight consecutive "1"s, the renormalization shift clock 121 is suspended and the code register $30e$ inputs 1 bit from the code bit stream so as to execute addition at the last bit of the internal 9-bit register.

If the update of the order and the predicted value is necessary, the updating signal 108 is output from the order and predicted value controller 6, and the first updating signal $108a$ or the second updating signal $108b$ which corresponds to the reference pixel A in the state of "1" or the reference pixel A in the state of "0" is generated on the basis of the value of the preceding information source symbol reproduced by the selector 13, thereby updating the contents of the order and predicted value memory 2. If the preceding reference symbol pattern 102 read out of the order and predicted value memory is coincident with the updating reference symbol pattern 190, the contents of the order and predicted value temporary register 8 are simultaneously updated. The updating processing is executed in one system clock period after the values are stored in the A-register $30a$ and the C-register $30c$.

The decoding process time T is expressed by the following formula in the same way as the encoding processing time:

$$T = 100 + 100 * Na + 100 * Nc + 100 * a \ (nsec)$$

Thus, a great increase in the processing speed is also realized by this embodiment in comparison with a conventional decoding device

Embodiment 4.2

Figure 16:
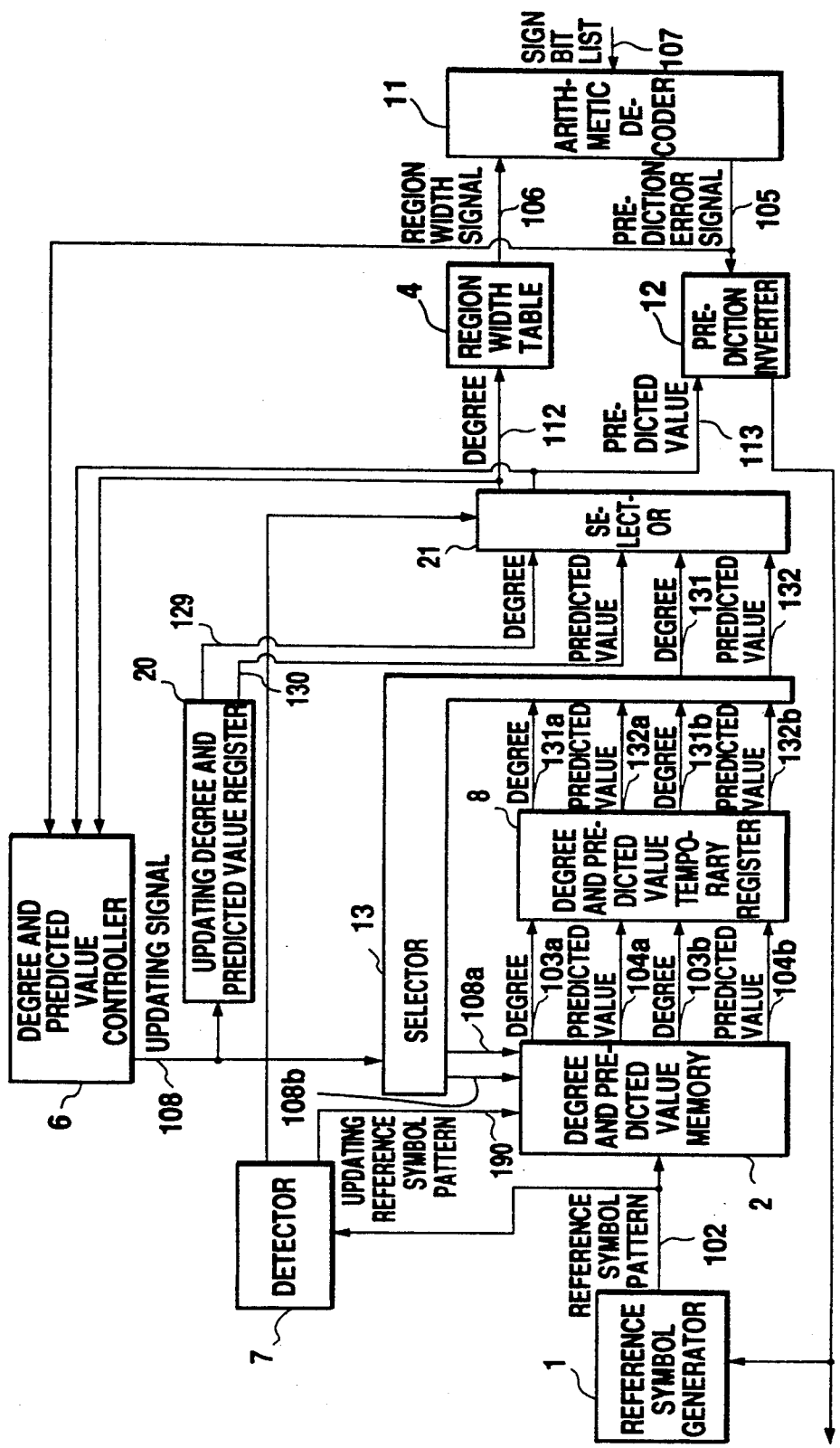
FIG. 16 is a block diagram of the structure of another embodiment of a decoding device according to the fourth aspect of the present invention.

FIG. 16 shows another embodiment of a decoding device according to a fourth aspect of the present invention. This embodiment is different from the embodiment shown in FIG. 13 in that the updating order and predicted value register 20 is provided separately from the order and predicted value temporary register 8 for storing the signal read out of the order and predicted value memory 2 and the selector 21 is added in the same way as the encoding device shown in FIG. 12.

In the same way as in the embodiment shown in FIG. 12, the detection output 111 of the detector 7 is delayed by one symbol in comparison with the embodiment shown in FIG. 13.

As described above, a method of controlling the update of the order and the predicted value by counting the number of LPSs and MPSs is used in Embodiments 3 and 4, but a method of controlling the update only when renormalization is executed, as disclosed in the IBM journal of research and development described above, may also be adopted.

Embodiment 5

Figure 17:
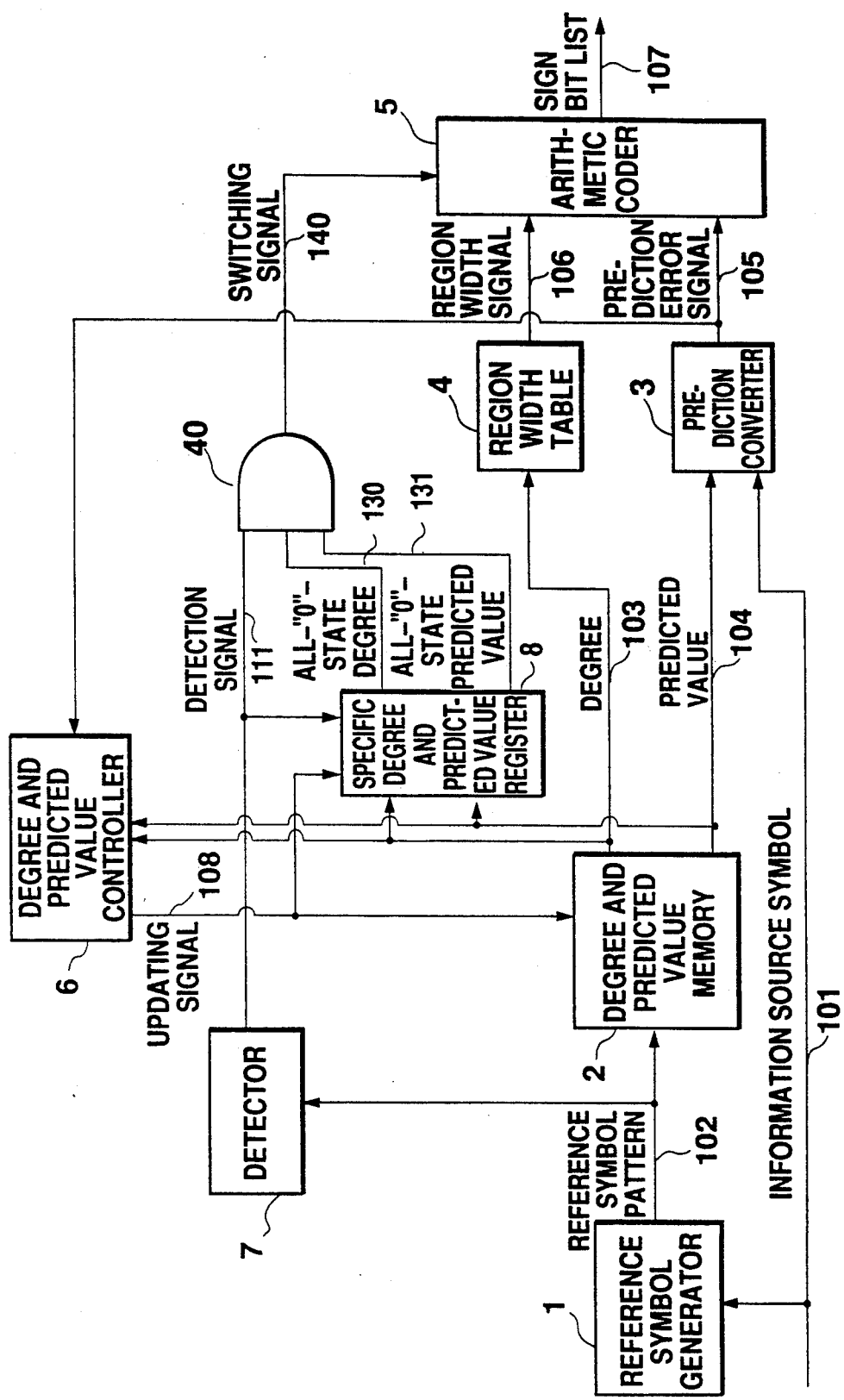
FIG. 17 is a block diagram of the structure of an embodiment of an encoding device according to a fifth aspect of the present invention.

FIG. 17 shows an embodiment of an encoding device according to a fifth aspect of the present invention. A characteristic of the encoding device shown in FIG. 17 as compared with the conventional encoding device shown in FIG. 25 is that the former is provided with the detector 7 for monitoring the reference symbol patterns 102 so as to judge whether or not all the twelve pixels of the reference symbol patterns (in FIG. 26) both for the eight consecutive symbols which were the objects of the preceding encoding operations and for the encoding symbol are "0" (white pixels). The encoding device of this embodiment is also provided with the specific degree and predicted value register 8 for storing the degree and the predicted value when all the twelve pixels (the reference symbol pattern 102) are "0". The encoding device is further provided with a first AND circuit 40 for obtaining the AND of the detection output 111 of the detector 7, an all-"0"-state order signal 130, which indicates that the order output from the specific order and predicted value register 8 when all the twelve reference pixels are "0" is the maximum order, namely, 16, and an all-"0"-state predicted value signal 131, which indicates that the predicted value when all the twelve reference pixels are "0" is "0".

Figure 18:
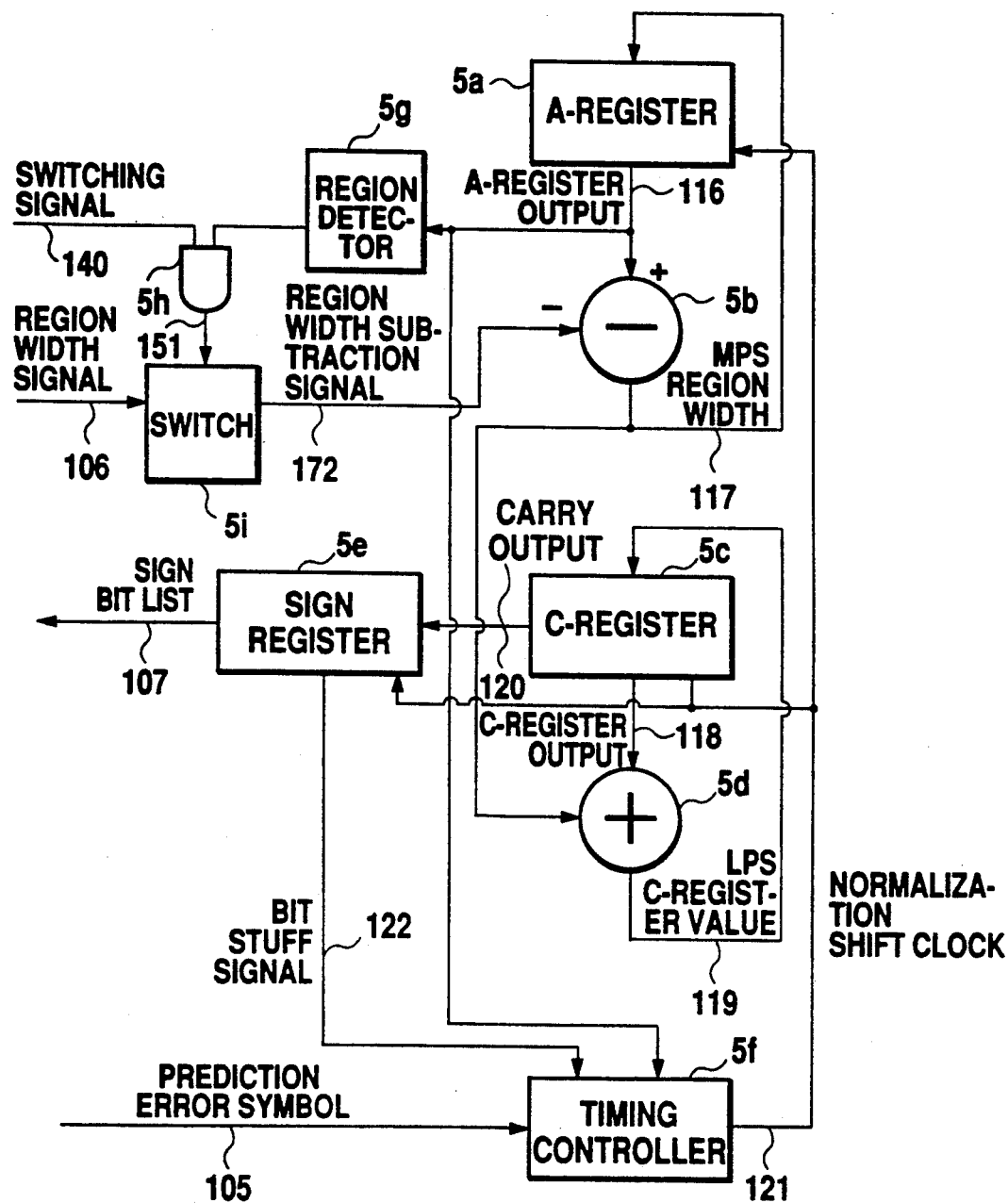
FIG. 18 is a block diagram of the internal structure of an arithmetic coder in the encoding device shown in FIG. 17.

FIG. 18 is a block diagram of the internal structure of the arithmetic coder 5. In FIG. 18, the A-register $5a$ stores the effective region $A_i$ on the number line, and the subtracter $5b$ calculates the MPS region width 117. The C-register $5c$ stores the coordinate 115 of the lower boundary. The adder $5d$ calculates the C-register value 119 in the case of an LPS. The code register $5e$ temporarily stores the carry output 120, which is an overflow (shift-out) signal of the C-register $5c$, and executes a carrying operation at the time of updating the C-register $5c$. When the contents of the code bits stored in the code register $5e$ are eight consecutive "1"s, the code register $5e$ inserts "0" from below the last bit so that the influence of the subsequent carrying operations is limited to the inserted "0" or subsequent bits (this processing will be referred to as "bit stuff processing" hereinunder in the same way as in Embodiment 1). The timing controller $5f$ controls the operation of the arithmetic coder 5.

A region detector $5g$ detects that the A-register output exceeds $0_X1000 + 0_X008$. A second AND circuit $5h$ calculates the AND of the output of the region detector $5g$ and a switching signal 140 output from the first AND circuit 40. A switch $5i$ multiplies the region width signal 106 by 8 when the output of the second AND circuit $5h$ is "1". This embodiment is different from a conventional device in that the elements $5g$ to $5i$ are added.

The operation of this embodiment will now be explained.

Figure 19:
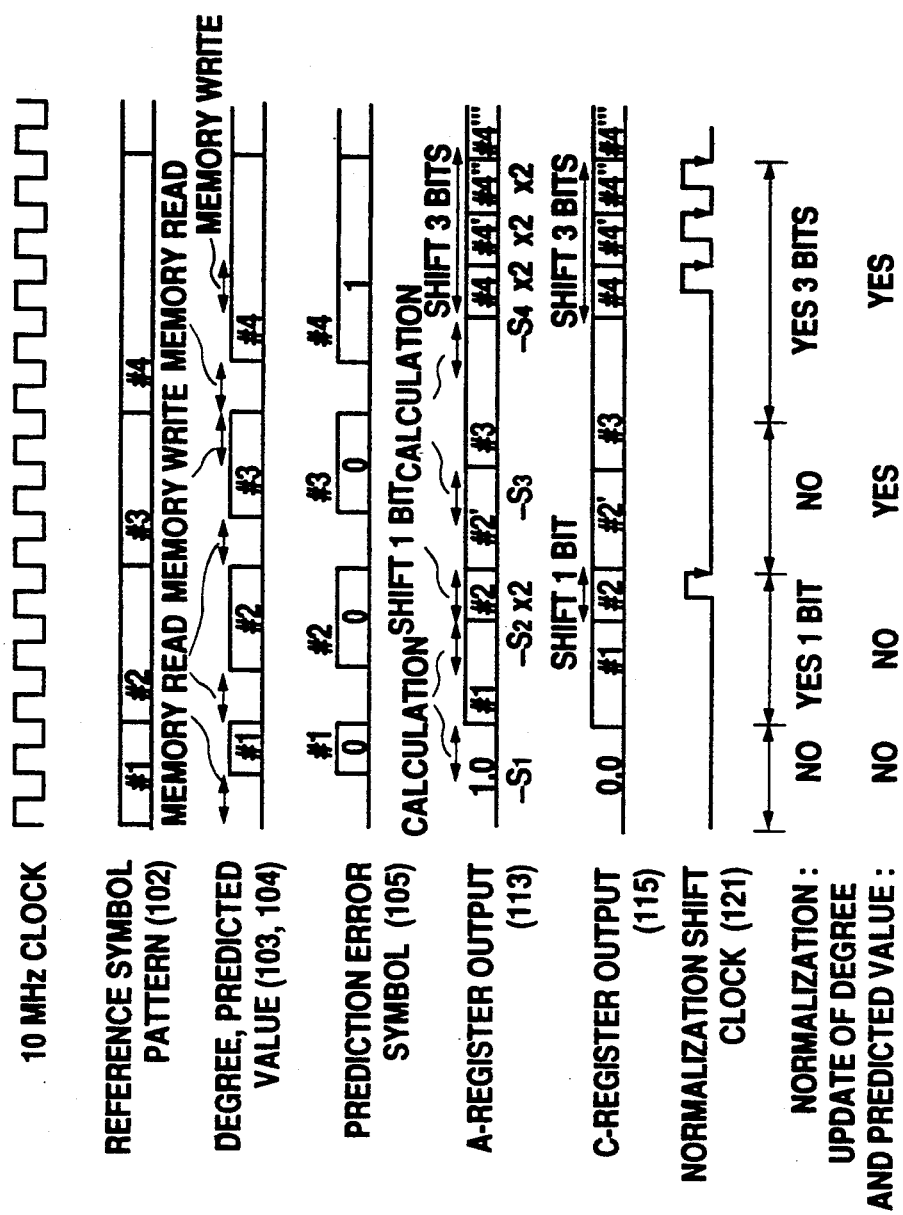
FIG. 19 is a timing chart of an example of the operation of the encoding device shown in FIG. 17.
Figure 20:
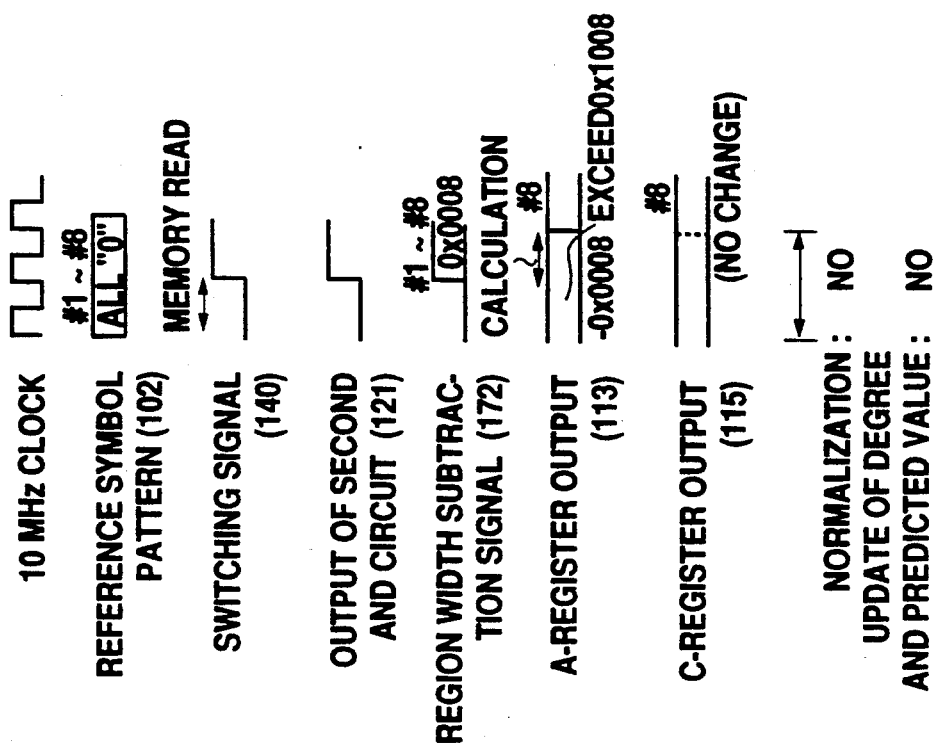
FIG. 20 is a timing chart of another example of the operation of the encoding device shown in FIG. 17.

FIGS. 19 and 20 are timing charts of examples of the operation of this embodiment. In order to make the explanation easy to understand, the case in which not all the reference symbol patterns 102 for the eight consecutive pixels which were the objects of the preceding encoding operations are "0" (this state will be called [all "0" state] hereinunder) and the case in which all the reference symbol patterns 102 for the eight consecutive pixels which were the objects of the preceding encoding operation are "0" will be explained separately.

In the all-"0" state, when a symbol being encoded is input to the encoding device as the information source symbol 101, the reference symbol patterns 102 each having the values of the 12 pixels which have already been processed by the reference symbol generator 1, as shown in FIG. 26, are output and the detector 7 detects that not all the reference symbol patterns for the eight consecutive symbols are "0". Therefore, "0" is output as the detection signal 111. Simultaneously with this, the order and predicted value memory 2 outputs the order signal 103 and the prediction value signal 104 in the reference symbol pattern for the encoding symbol. In this embodiment, the reading operation of the order and predicted value memory 2 is executed in 100 nsec, which corresponds to one period of a 10 MHz system clock.

The order signal 112 is converted to the region width signal 106 shown in FIG. 28 by the region width table 4. The prediction error symbol 105 is generated by the exclusive OR operation of the predicted value signal 104 and the current information source symbol 101 in the prediction converter 3, which is an EX-OR gate. Thereafter, the effective region $A_i$ and the coordinate $C_i$ of the lower bound thereof are calculated and the order and the predicted value are updated as follows.

(1) When there is neither renormalization nor update of the order and the predicted value (when the encoding symbol is #1 in FIG. 19), the calculations of the effective region $A_i$ and the coordinate $C_i$ of the lower boundary are executed in one system clock period.

(2) When there is renormalization but there is no update of the order and the predicted value (when the encoding symbol is #2 in FIG. 19), the calculations of the effective region $A_i$ and the coordinate $C_i$ of the lower boundary except renormalization are executed in one system clock period and the renormalization is executed in m clocks (when the renormalization requires a multiplier of $2^m$).

(3) When there is no renormalization but there is update of the order and the predicted value (when the encoding symbol is #3 in FIG. 19), the calculations of the effective region $A_1$ and the coordinate $C_i$ of the lower boundary are executed in one system clock period and thereafter the contents of the degree and predicted value memory 2 are updated in two system clock periods.

(4) When there are both renormalization and update of the order and the predicted value (when the encoding symbol is #4 in FIG. 19), after the calculations of the effective region $A_i$ and the coordinate $C_i$ of the lower boundary except renormalization are executed in one system clock period, renormalization is executed in m clocks (when the renormalization requires a multiplier of $2^m$). The update of the order and the predicted value is executed in parallel with the renormalization. The processing of the next encoding symbol is executed after both the renormalization and the update of the contents of the order and predicted value memory 2 are finished.

When the order and the predicted value are updated in the all-"0" state, the contents of the order and predicted value register 8 are also updated together with the contents of the order and predicted value memory 2.

The calculations of the effective region $A_i$ and the coordinate $C_i$ of the lower boundary including the judgment of the prediction error signal (LPS or MPS) are controlled by the timing controller 5f of the arithmetic coder 5 on the basis of the prediction error symbol 105 and the MSB signal 116 output from the A-register 5a. The update of the contents of the order and predicted value memory 2 is controlled by the order and predicted value controller 6.

In the code register 5e, the carrying operation is executed in parallel with the calculations of the effective region $A_i$ and the coordinate $C_i$ of the lower boundary except renormalization. At the time of renormalization, the carry output of the eighth and subsequent bits is output as a code bit stream in accordance with the shifting operation of the internal register. When all the 8 bits of the internal register are "1", the bit stuff signal 122 is supplied to the timing controller 5f. The timing controller 5f suspends a renormalization shift clock 121 and shifts 1 bit (an LSB shift-in signal "0" is output) into the internal register in one system clock period.

In the case in which all the reference symbol patterns 102 for the eight consecutive symbols are "0", the first and second AND circuits 40 and 5h judge whether or not the arithmetic operation is executed as batch processing. The output 151 of the second AND circuit 5h is "1" when all the corresponding symbols being encoded are "0" (the detection signal 111 is "1"), the order in the all-"0" state is 16 (the all "0"-state order signal 130 is "1"), and the predicted value in this state is "0" (the all-"0"-state predicted value signal 131 is "1"). If the output signal 151 of the second AND circuit 5h is "0", the above described processing is executed in accordance with the timing chart shown in FIG. 19.

When batch processing is executed, the region width signal 106 is multiplied by 8, and "0x0008" is supplied to the subtracter 5b as a subtraction input 152 for arithmetic operation. Since the preceding A-register output 116 exceeds 0x1008, the result of the arithmetic operation exceeds 0x1000, thereby obviating renormalization processing. Since there is no update of the order and the predicted internal value, the process proceeds to the encoding of the symbol which is the object of the next encoding operation, namely, the ninth pixel. This region operation requires only one system clock cycle in accordance with the timing chart shown in FIG. 20.

In the above, the case in which all the consecutive reference symbol patterns 102 are "0" and the case in which not all the consecutive reference symbol patterns 102 are "0" are explained separately from each other, but both cases are included in the actual encoding of a picture signal. Therefore the operation timing for the encoding device of this embodiment is a combination of the timings for the respective cases shown in FIGS. 19 and 20.

As is clear from the above explanation, the encoding processing time T is expressed by the following formula:

$$T = 100(Na/8 + Nb) + 100 \cdot (Na/8 + Nb) + 100 \cdot Nc + 100 \cdot a \text{ (nsec)}$$

wherein Na represents the number of symbols being encoded when batch processing is possible, (when all the reference symbol patterns for eight consecutive pixels being encoded are "0", the corresponding eight symbols being encoded are "0", the order in the all-"0" state is 16, the predicted value in the all-"0" state is "0", and the effective region $A_i$ exceeds 0x1000+0x008), Nb the number of symbols in the other cases, Nc the number of code bits, and a represents the number of clocks required for the update of the order and the predicted value in the case (3).

The encoding processing time required for encoding the picture information in an A4-size copy in a standard facsimile equipment at a resolution of 8 horizontal pixels/mm and 7.7 vertical lines/mm will now be calculated. If it is assumed that the ratio of the case which allows batch processing is ⅔ and the compression ratio is 30, $$Na = 1728 * 2376 * (⅔)$$

$$Nb = 1728 * 2376 * (⅓)$$

$$Nc = 1728 * 2376 * (1/30).$$

The encoding processing time T is about 0.35 sec. In this case, since the symbols required to update the orders and the predicted values is between about 1/50 and 1/200 of all the symbols, the influence of a is negligible.

In contrast, in a conventional encoding device, $$Na = 0$$

$$Nb = 1728 * 2376$$

$$Nc = 1728 * 2376 * (1/30).$$

The encoding processing time T is about 0.83 sec. It will be understood that the encoding processing speed is greatly increased in the present invention.

Embodiment 6

Figure 21:
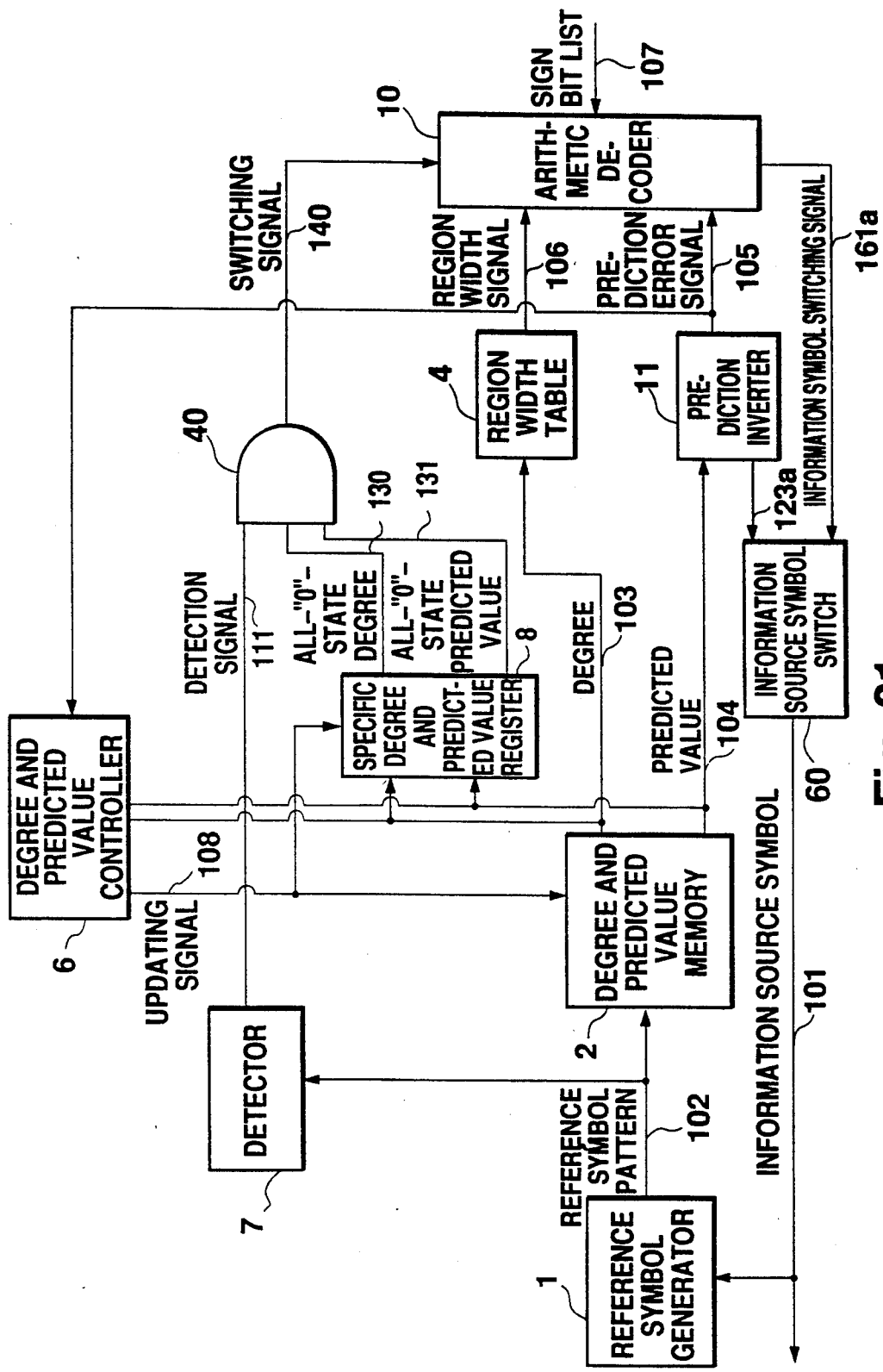
FIG. 21 is a block diagram of the structure of an embodiment of a decoding device according to a sixth aspect of the present invention.

FIG. 21 is a block diagram of an embodiment of a decoding device according to a sixth aspect of the present invention. This embodiment is a decoding device for decoding a code bit list encoded by the encoding device provided in the fifth aspect of the present invention. In FIG. 21, the arithmetic decoder 10 reproduces the prediction error symbol 105 from the code bit stream on the basis of the region width signal 106. The prediction inverter 11 reproduces the information source symbol 101 by the exclusive-OR operation of the prediction error symbol 105 and the predicted value 104. An information symbol switch (selector) 60 receives a batch processing judging signal 161 from the arithmetic decoder 10. In the case of ordinary processing, the information source symbol switch 60 outputs the output of the prediction inverter 11 as it is, while in the case of batch processing, it outputs eight consecutive "0"s. The other portions are the same as in the embodiment shown in FIG. 17.

Figure 22:
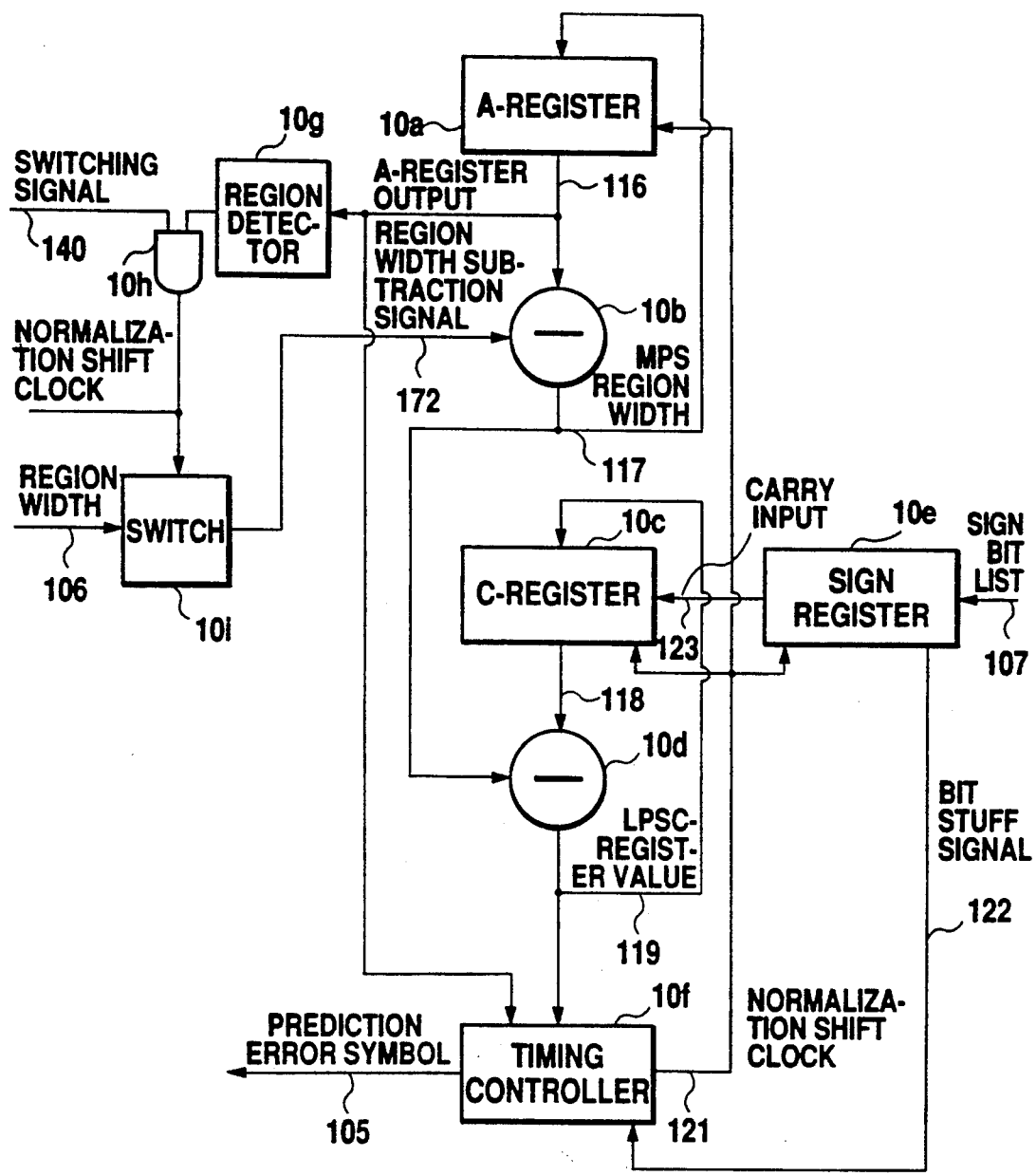
FIG. 22 is a block diagram of the internal structure of an arithmetic decoder in the decoding device shown in FIG. 21.

FIG. 22 is a block diagram of the internal structure of the arithmetic decoder. The A-register 10a stores the effective region $A_i$ on the number line. The subtracter 10b calculates an MPS region width 117 and the C-register 10c stores the coordinate of the lower boundary thereof. The subtracter 10d calculates the C-register value 119 in the case of an LPS. The code register 10e temporarily stores the code bit stream and supplies the first zone bit signal of the 9-bit internal register to the C-register 10c in accordance with a renormalization shift clock 121. When the 8 bits stored in the code register 10e are eight consecutive "1"s, the code register 10e inputs 1 bit from the code bit stream so as to execute addition at the last bit of the internal 9-bit register, thereby eliminating the bit stuff signal inserted by the arithmetic coder 5 shown in FIG. 17. The operation of the arithmetic decoder 10 is controlled by the timing controller 10f. A region detector 10g detects that the output of the A-register 10a exceeds 0x1000 + 0x008. A second AND circuit 10h calculates the AND of the output of the region detector 1g and the switching signal 140 output from the first AND circuit 40. A switch 10i multiplies the region width signal 106 by 8 when the output of the second AND circuit 10h is "1".

The operation of this embodiment will now be explained.

An arithmetic code is decoded by the following operation. In the following, it is assumed that the relative coordinate, which is the content of the C-register 10c is $C_i$ and the region width of the LPS at the point of the i th prediction error symbol $a_i$ is S.

If $C_{i-1} < (A_{i-1} - S)$, $a_i$ is an MPS, and so $A_i$ and $C_i$ are updated as follows:

$$A_i = A_{i-1} - S$$

$$C_i = C_{i-1}$$

If $C_{i-1} \geq (A_{i-1} - S)$, ai is an LPS, and $A_i$ and $C_i$ are updated as follows:

$$A_i = S$$

$$C_i = C_{i-1} + (A_{i-1} - S).$$

When the effective region $A_i$ is not more than κ, $A_i$ is multiplied by an m-th power of 2 as renormalization operation in order to enhance the accuracy. At this time, a carry input signal 170 output from the sign register 10e is input to the C-register 10c from the last digit bit. By this operation, $A_i$ and $C_i$ are updated as follows:

$$\text{Updated } A_i = A_i * 2^m (\tfrac{1}{2} \text{updated } A_i \leq 1)$$

$$\text{Updated } C_i = C_i * 2^m$$

Figure 23:
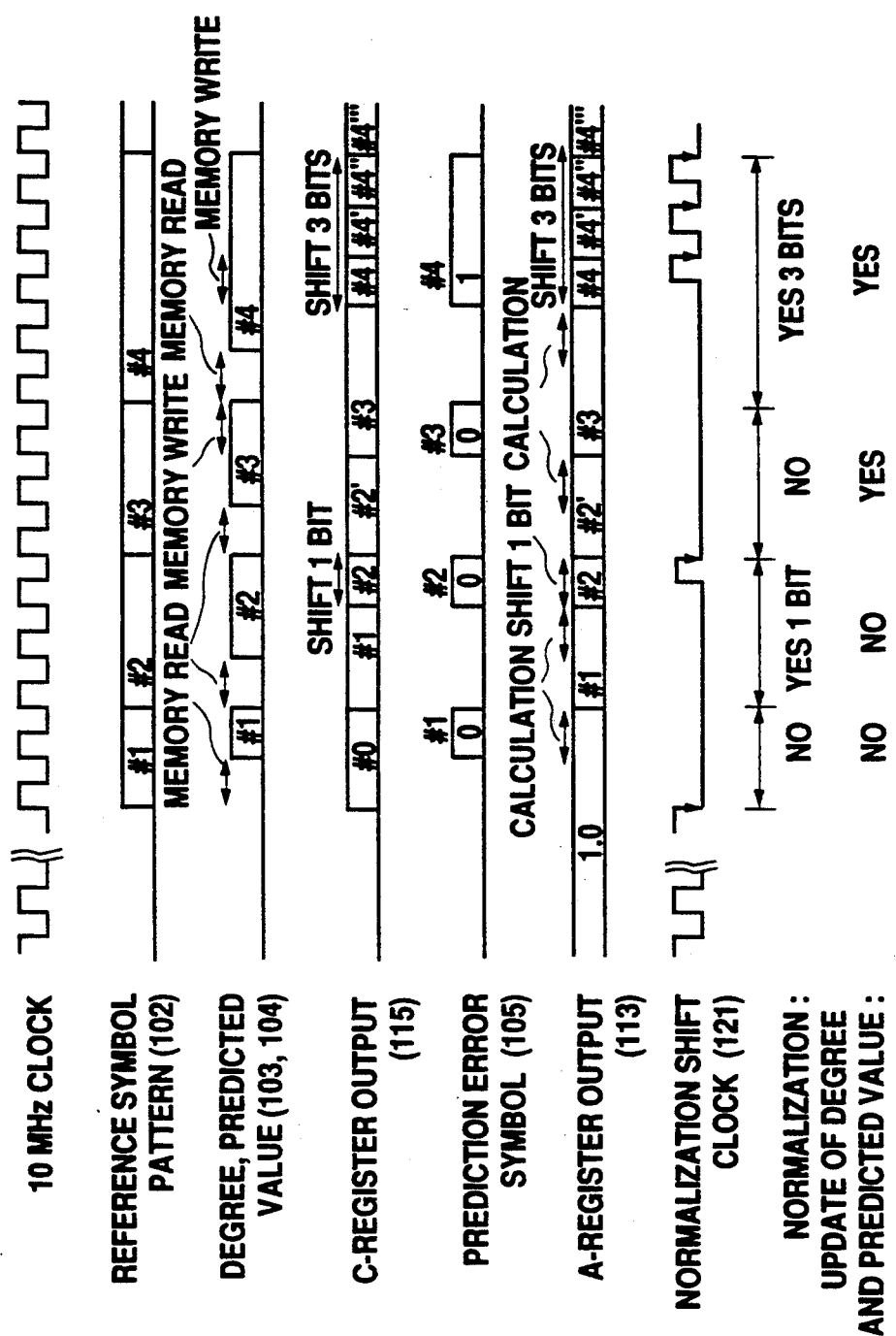
FIG. 23 is a timing chart of an example of the operation of the decoding device shown in FIG. 21.
Figure 24:
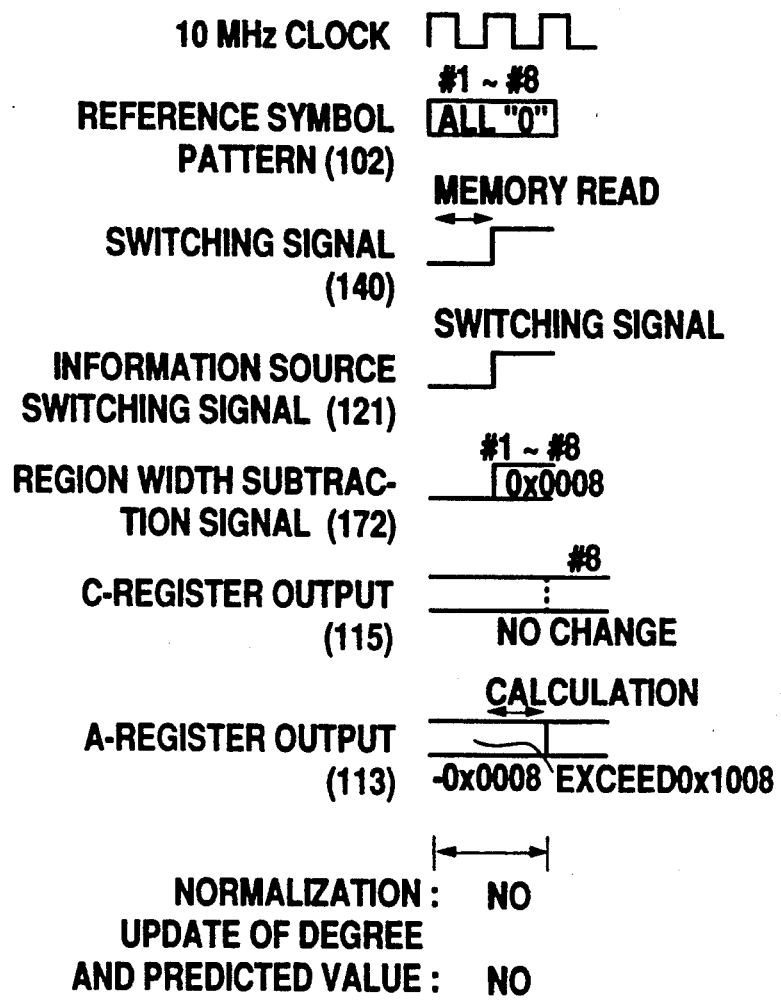
FIG. 24 is a timing chart of another example of the operation of the decoding device shown in FIG. 21.

FIGS. 23 and 24 are timing charts of examples of the operation of this embodiment. FIG. 23 shows a timing for ordinary processing as that shown in FIG. 19, and FIG. 24 shows a timing for batch processing. The generation of the reference symbol pattern 102 and the update of the order and the predicted value are the same as in the embodiment shown in FIG. 5.

Ordinary processing will first be explained. In producing the prediction error symbol $a_i$ and calculating the effective region $A_i$ and the relative coordinate $C_i$, $C_{i-1}$ and $(A_{i-1} - S)$ are first compared by the timing controller 10f so as to determine whether the symbol $a_i$ is an MPS or an LPS. On the basis of the result of the comparison, $A_i$ and $C_i$ are calculated and the results are stored in the A-register 10a and the C-register 10c, respectively. This series of processing is carried out in one system clock period.

When the effective region $A_i$ is less than ½ as a result of the calculation, the renormalization processing is carried out in m clocks (when the normalization requires a multiplier of $2^m$), as described above. At this time, when the 8 bits stored in the code register 10e are eight consecutive "1"s, the renormalization shift clock 121 is suspended and the code register 10e inputs 1 bit from the code bit stream so as to execute addition at the last bit of the internal 9-bit register.

Batch processing will now be explained. Batch processing is executed when all the reference symbol patterns for eight consecutive pixels being decoded except a pixel which has not been reproduced are "0" (the detection signal 111 is "1"), the order in the all-"0" state is 16 (the all-"0"-state degree signal 130 is "1"), the predicted value in this state is "0" (the all "0" state predicted value signal 131 is "1"), and the effective region $A_i$ exceeds $0_x1000+0_x008$ (the output 192 of the region width detector 1g is "1"). In this case, the switch 10i uses "$0_x1000$" as a region width subtraction signal 172 in the same way as in FIG. 18, and arithmetic operation of the eight consecutive symbols being decoded is executed. This processing is carried out in one system clock period as in FIG. 19. As the information source symbols 101 which are reproduced, eight consecutive "0"s are output from the information symbol switch 60 irrespective of the output of the prediction inverter 11.

The decoding processing time T is expressed by the following formula in the same way as the encoding processing time:

$$T = 100(Na/8 + Nb) + 100 * (Na/8 + Nb) + 100*Nc + 100*a (nsec)$$

$$T = 200*Na + 100*(Na + Nb) + 100*Nc + 100*a (nsec).$$

Thus, a great increase in processing speed is also realized by this embodiment in comparison with a conventional decoding device.

Although a special register is provided for the purpose of increasing the processing speed only in the case in which all the pixels of the reference symbol pattern 102 are "0" in this embodiment, a plurality of special registers may be further provided including a special register for the case in which all the pixels of the reference symbol pattern 102 are "1".

In addition, batch processing is executed only when the degree is the maximum, namely, 16 in this embodiment, but similar batch processing may be executed when the order is another value. For example, when the order is 15, the criterion for judging the region width by the region detector 1g may be set at $0_x1000+0_x010$ (that is, the region detector 1g judges whether or not the effective region $A_i$ exceeds $0_x1000+0_x010$).

In this embodiment, the order and the predicted value in a specific reference symbol pattern are also read out of the order and predicted value memory 2, but it is also preferable to provide a selector for switching the order and the predicted value so that when all the pixels of the reference pattern are "0", neither reading nor updating of the order and the predicted value is executed, as in Embodiment 1.

Furthermore, although a method of updating the order and the predicted value on the basis of the numbers of LPSs and MPSs is used in this embodiment, a method of updating them according to whether the symbol at the point of time when renormalization is necessary is an MPS or an LPS, as disclosed in the IBM journal of research and development described above, may also be adopted.

As described above, the encoding and decoding devices provided in the first and second aspects, respectively, of the present invention comprise an order and predicted value memory for storing the predicted value and the order of a symbol being encoded or decoded in correspondence with the reference symbol pattern therefor, a detector for detecting that the reference symbol pattern is a specific pattern, a specific order and predicted value register for storing the predicted value and the order of the specific reference symbol pattern, and a selector for selecting either the order and predicted value memory or the specific order and predicted value register. Since these devices use not the order and predicted value memory but the specific order and predicted value register having a higher access speed as an order and predicted value table, the encoding and decoding speed is greatly increased.

The encoding and decoding devices provided in the third and fourth aspects, respectively, of the present invention comprise an order and predicted value temporary register for storing the predicted value and the order of the encoding symbol or decoded which are read out of the order and predicted value memory, and, if necessary, storing the updated predicted value and order of the symbol which was the object of the preceding encoding or decoding operation, and a detector for judging whether or not the value of reference symbol for the encoding symbol is coincident with the reference symbols for the symbol which was the object of the preceding encoding operation. Since the retrieval of the order and predicted value table for the symbol which is the object of the next encoding or decoding operation is carried out in parallel with the calculations of the region on the number line for the symbol being the encoding symbol or decoded, the encoding and decoding speed is greatly increased.

The encoding and decoding devices provided in the fifth and sixth aspects, respectively, of the present invention comprise an order and predicted value memory for sorting the predicted value and the order of an encoding symbol or decoded in correspondence with a reference symbol pattern, and a detector for detecting that a specific reference symbol pattern is consecutive. Since batch processing of a plurality of symbols being encoded or decoded is executed when the specific reference symbol pattern is consecutive, the encoding and decoding speed is greatly increased.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of said symbol to be encoded, said encoding device comprising:

(a) a reloadable order and predicted value memory for storing the predicted value of said symbol to be encoded, and an order which is an indicator of a percentage of accurate prediction;

(b) a specific pattern detector for detecting that the values of said plurality of reference symbols are a predetermined specific reference symbol pattern or one of a number of predetermined specific reference symbol patterns and for providing a detection signal;

(c) at least one specific reloadable order and predicted value register for storing said order and said predicted value when said specific reference symbol pattern is detected, said register being accessible at a higher speed than said order and predicted value memory;

(d) a selector for choosing between an output of said order and predicted value memory and an output of said specific order and predicted value register in accordance with the detection signal;

(e) a prediction converter for outputting a prediction error signal which indicates a difference between said predicted value selected and output by said selector, and said actual value of said symbol to be encoded;

(f) an arithmetic coder for encoding said prediction error signal on the basis of the information on said predicted value and said order which are selected and output by said selector; and (g) an order and predicted value controller for judging whether or not said actual value of the encoding symbol is coincident with said predicted value, and for updating said predicted value and said order which correspond to the values of said plurality of reference symbols in said order and predicted value memory or in said specific order and predicted value register in accordance with the result of said judgment.

2. A decoding device for decoding a code bit stream obtained by encoding an output symbol stream which is output from an information source by predicting a value for each symbol to be encoded from values of a plurality of reference symbols at predetermined positions in said output symbol stream resulting in a predicted value and by encoding a prediction error signal and an actual value of the symbol to be encoded, said decoding device comprising:

(a) a reloadable order and predicted value memory for storing the predicted value of said symbol to be encoded which is predicted from the values of said plurality of reference symbols, and an order which is an indicator of a percentage of accurate prediction;

(b) a specific reference symbol pattern detector for detecting that the values of the plurality of reference symbols are a predetermined specific reference symbol pattern or one of a number of predetermined specific reference symbol patterns and for providing a detection signal;

(c) at least one specific reloadable order and predicted value register for storing said order and said predicted value when said specific reference symbol pattern is detected;

(d) a selector for choosing between an output of said order and predicted value memory and an output of said specific order and predicted value register in accordance with the detection signal output from said detector;

(e) an arithmetic decoder for decoding said code bit stream on the basis of the information on said order which is selected and output by said selector and for outputting a prediction error signal;

(f) a prediction inverter for converting said prediction error signal output from said arithmetic decoder into said output symbol stream which is output from said information source on the basis of the information on said predicted value which is selected and output by said selector; and (g) an order and predicted value controller for judging whether or not the decoded symbol is coincident with said predicted value, and updating said predicted value and said order which correspond to the values of said plurality of reference symbols in said order and predicted value memory or in said specific order and predicted value register in accordance with the result of said judgment.

3. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of said symbol to be encoded, said encoding device comprising:

(a) a reloadable order and predicted value memory for storing the predicted value of said symbol to be encoded which is predicted from the values of said plurality of reference symbols, and an order which is an indicator of a percentage of accurate prediction;

(b) an order and predicted value controller for judging whether or not the actual value of said to be encoded symbol is coincident with said predicted value, and for updating said predicted value and said order which correspond to the values of said plurality of reference symbols in said order and predicted value memory in accordance with the result of said judgment;

(c) an order and predicted value temporary register for storing said predicted value and said order of said symbol being encoded which are read out of said order and predicted value memory, and, if necessary, for storing said predicted value and said order of said symbol which is an object of a preceding encoding operation, said predicted value and said order having been updated by said order and predicted value controller;

(d) a detector for judging whether or not the values of said plurality of reference symbols for said symbol to be encoded are coincident with the values of said plurality of reference symbols for said symbol which is the object of the preceding encoding operation, and for updating the contents of said order and predicted value temporary register in accordance with the result of said judgment;

(e) a prediction converter for outputting the prediction error signal which indicates a difference between said predicted value output from said order and predicted value temporary register and the actual value of said encoding symbol; and (f) an arithmetic coder for encoding said prediction error signal on the basis of the information on the order which is output from said order and predicted value temporary register.

4. A decoding device for decoding a code bit stream obtained by encoding an output symbol stream which is output from an information source by predicting a value for each symbol to be encoded from values of a plurality of reference symbols at predetermined positions in said output symbol stream resulting in a predicted value and by encoding a prediction error signal and an actual value of the symbol to be encoded, said decoding device comprising:

(a) a reloadable order and predicted value memory for storing the value of said symbol to be encoded which is predicted from the values of said plurality of reference symbols, and an order which is an indicator of the percentage of accurate prediction;

(b) an order and predicted value controller for judging whether or not said actual value of said symbol being decoded is coincident with said predicted value, and updating said predicted value and said order for the values of said plurality of reference symbols in said order and predicted value memory in accordance with the result of said judgment;

(c) an order and predicted value temporary register for storing said predicted value and said order of said symbol being decoded which are read out of said order and predicted value memory, and, if necessary, for storing said predicted value and said order of the symbol which is the object of a preceding decoding operation, said predicted value and said order having been updated by said order and predicted value controller;

(d) a detector for judging whether or not the values of said plurality of reference symbols for said symbol being decoded are coincident with values of the plurality of reference symbols for said symbol which is the object of the preceding decoding operation, and for updating the contents of said order and predicted value temporary register in accordance with the result of said judgment;

(e) a selector for selecting one set of predicted values and orders from plural sets of outputs of said order and predicted value memory for values of said plurality of reference symbols;

(f) an arithmetic decoder for decoding said code bit stream on the basis of the information on said predicted value and said order which are selected by said selector and for outputting a prediction error signal; and (g) a prediction inverter for reproducing said output symbol of said information source on the basis of said prediction error signal output from said arithmetic decoder and said predicted value selected by said selector.

5. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of said symbol to be encoded, said encoding device comprising:

(a) a reloadable order and predicted value memory for storing the predicted value of said symbol to be encoded which is predicted from the values of said plurality of reference symbols, and an order which is an indicator of a percentage of accurate prediction;

(b) a detector for detecting whether all the values of said plurality of reference symbols for a plurality of consecutive encoding symbols are a specific reference symbol pattern and whether all said predicted values of said encoding symbols are coincident with said actual values thereof;

(c) a prediction converter for calculating the prediction error signal of said symbol to be encoded on the basis of said predicted value stored in said order and predicted value memory;

(d) an order and predicted value controller for judging whether or not said actual value of said symbol to be encoded is coincident with said predicted value, and for updating said predicted value and said order which correspond to the values of said plurality of reference symbols in said order and predicted value memory in accordance with the result of the judgment; and (e) an arithmetic coder for encoding said prediction error signal which is calculated by said prediction converter on the basis of the information on said order stored in said order and predicted value memory.

6. A decoding device for decoding a code bit stream obtained by encoding an output symbol stream which is output from an information source by predicting a value for each symbol to be encoded from values of a plurality of reference symbols at predetermined positions in said output symbol stream resulting in a predicted value and by encoding a prediction error signal and an actual value of the symbol to be encoded, said decoding device comprising:

(a) a reloadable order and predicted value memory for storing the value of said symbol to be encoded which is predicted from the values of said plurality of reference symbols, and an order which is an indicator of a percentage of accurate prediction;

(b) a detector for detecting whether all the values of the plurality of reference symbols for a plurality of consecutive symbols being decoded are a specific reference symbol pattern wherein the predicted values of said plurality of consecutive symbols being decoded are coincident with the actual values thereof;

(c) an arithmetic decoder for decoding said code bit stream and for generating a prediction error signal on the basis of the information on said order stored in said order and predicted value memory;

(d) a prediction inverter for reproducing said symbol being decoded on the basis of said prediction error signal generated by said arithmetic decoder and said predicted value output from said order and predicted value memory; and (e) an order and predicted value controller for judging whether or not the decoded symbol is coincident with said predicted value, and for updating said predicted value and said order which correspond to the values of said plurality of reference symbols in said order and predicted value memory in accordance with the result of said judgment.

7. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of the symbol to be encoded, said encoding device comprising:

(a) a reloadable order and predicted value memory for storing the predicted value of the symbol to be encoded, and an order which is an indicator of a percentage of accurate prediction;

(b) a pattern detector for detecting reference symbol patterns and for providing an output;

(c) a reloadable order and predicted value register for storing said order and said predicted value of a reference symbol pattern;

(d) a selector for choosing between an output of said order and predicted value memory and an output of said order and predicted value register in accordance with said output of said pattern detector; and (e) an arithmetic coder for encoding said prediction error signal on the basis of said predicted value and said order.

8. An encoding device as in claim 7, further including:

(f) a detector for judging whether or not the values of said plurality of reference symbols for said symbol being encoded are coincident with the values of said plurality of reference symbols for said symbol which is object of a preceding encoding operation; and (g) means for updating the contents of said order and predicted value temporary register in accordance with a result of said judgment by said detector.

9. A decoding device for decoding a code bit stream obtained by encoding an output symbol stream which is output from an information source by predicting a value for each symbol to be encoded which constitutes said output symbol stream from values of a plurality of reference symbols at predetermined positions in said output symbol stream resulting in a difference between a predicted value and by encoding a prediction error signal which indicates a difference between said predicted value and an actual value of the symbol to be encoded, said decoding device comprising:

(a) a reloadable order and predicted value memory for storing the predicted value of a symbol which is predicted from the values of said plurality of reference symbols, and an order which is an indicator of the percentage of accurate prediction;

(b) a pattern detector for detecting reference symbol patterns;

(c) a reloadable order and predicted value register for storing said order and said predicted value of a specific reference symbol pattern;

(d) a selector for choosing between an output of said order and predicted value memory and an output of said order and predicted value register in accordance with an output of said pattern detector; and (e) an arithmetic coder for encoding said prediction error signal on the basis of the information on said predicted value and said order.

10. A decoding device as in claim 9, further including:

(f) a detector for judging whether or not the values of said plurality of reference symbols for said symbol being decoded are coincident with the values of said plurality of reference symbols; and (g) means for updating the contents of said order and predicted value of the symbol pattern in accordance with the result of said judgment.

11. An encoding device for encoding an output symbol stream which is output from an information source by predicting a value of each symbol to be encoded from the values of a plurality of reference symbols at predetermined positions in said output stream resulting in a predicted value, and by encoding a prediction error signal which indicates a difference between said predicted value and an actual value of the symbol being encoded, said encoding device comprising:

(a) a reloadable order and predicted value memory for storing the predicated value of a symbol to be encoded, and an order which is an indicator of the percentage of accurate prediction;

(b) means for judging whether or not the values of said plurality of reference symbols for said symbol being encoded are coincident with the values of said plurality of reference symbols;

(c) an order and predicted value controller for updating said predicted value and said order in accordance with the result of said judgment;

(d) a detector for judging whether or not the values of said plurality of reference symbols for said symbol being encoded are coincident with the values of said plurality of reference symbols for said symbol which is the object of a preceding encoding operation, and for updating the contents of said order and predicted value register in accordance with the result of said judgment; and (e) an arithmetic coder for encoding said prediction error signal on the basis of the information on said predicted value and order which are stored in said order and predicted value register.

12. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of the symbol to be encoded, said encoding device comprising:

(a) a reloadable order and predicted value memory for storing the predicated value of a symbol to be encoded, and an order which is an indicator of a percentage of accurate prediction;

(b) means for judging whether or not the values of said plurality of reference symbols for said symbol being encoded are coincident with the values of said plurality of reference symbols;

(c) an order and predicated value controller for updating said predicated value and said order in accordance with the result of said judgment;

(d) an order and predicted value register for storing said predicted value and said order of said symbol encoded in a preceding encoding operation;

(e) a selector for choosing between an output of said order and predicted value memory and an output of said order and predicted value register in accordance with an output of said pattern detector; predicted value register; and (f) an arithmetic coder for encoding said prediction error signal on the basis of the information on said predicted value and said order which are selected by said selector.

13. A decoding device for decoding a code bit stream obtained by encoding an output symbol stream which is output from an information source by predicting a value for each symbol to be encoded which constitute said output symbol stream from values of a plurality of reference symbols at predetermined positions in said output symbol stream resulting in a difference between a predicted value and by encoding a prediction error signal which indicates a difference between said predicted value and an actual value of the symbol to be encoded, said decoding device comprising:

(a) a reloadable order and predicted value memory for storing the predicated value of said reference symbols, and an order which is an indicator of the percentage of accurate prediction; and (b) a selector for choosing between an output of said order and predicted value memory and an output of said order and predicted value register in accordance with an output of said pattern detector;

(c) an arithmetic decoder for decoding said code bit stream of orders from plural sets of outputs of said order and predicted value memory for values of said plurality of reference symbols.

14. A decoding device as in claim 13, further including:

(d) means for judging whether or not the values of said plurality of reference symbols for said symbol being encoded are coincident with the values of said plurality of reference symbols for said symbol which is the object of a preceding encoding operation;

(e) an order and predicted value controller for updating said predicted value and said order in accordance with the result of said judgment; and (f) a detector for judging whether or not the values of said plurality of reference symbols for said symbol being encoded are coincident with the values of said plurality of reference symbols for said symbol which is the object of the preceding encoding operation, and for updating the contents of said order and predicted value register in accordance with the result of said judgment.

15. A decoding device as in claim 13, further including:

(g) means for judging whether or not the values of said plurality of reference symbols for said symbol being decoded are coincident with the values of said plurality of reference symbols for said symbol which is the object of a preceding encoding operation;

(h) an order and predicted value controller for updating said predicted value and said order in accordance with the result of said judgment; and (i) a detector for updating the contents of said order and predicted value register in accordance with the result of said judgment; and (j) a second selector for selecting one set of predicted values and orders from plural sets of outputs of said order and predicted value memory or values of said plurality of reference symbols.

16. An encoding device for encoding symbols in an output symbol stream which is output from an information source by predicting a value for each symbol to be encoded from values of a plurality of reference symbols at predetermined positions in said output symbol stream resulting in a predicted value, and by encoding a prediction error signal which indicates a difference between said predicted value and an actual value of the symbol to be encoded, said encoding device comprising:

(a) a reloadable order and predicted value memory for storing the value of said encoding symbol which is predicted from the values of said plurality of reference symbols, and an order which is an indicator of a percentage of accurate prediction;

(b) a detector for detecting whether all the values of the plurality of reference symbols for a plurality of consecutive symbols being encoded are a specific reference symbol pattern if it is assumed that the predicted value of said plurality of consecutive symbols being encoded are coincident with the actual values thereof; and (c) an arithmetic coder for encoding said prediction error signal on the basis of the information on said predicted value and said order stored in said order and predicted value memory.

17. An encoding device as in claim 16, further including:

(d) means for judging whether or not the values of said plurality of reference symbols for said symbol being encoded are coincident with the values of said plurality of reference symbols for said symbol which is the object of a preceding encoding operation; and (e) an order and predicted value controller for updating said predicted value and said order which correspond to the values of said plurality of reference symbols.

18. A decoding device for decoding a code bit stream obtained by encoding an output symbol stream which is output from an information source by predicting a value for each symbol to be encoded which constitute said output symbol stream from values of a plurality of reference symbols at predetermined positions in said output symbol stream resulting in a difference between a predicted value and by encoding a prediction error signal which indicates a difference between said predicted value and an actual value of the symbol to be encoded, said decoding device comprising:

(a) a reloadable order and predicted value memory for storing the value of said encoding system which is predicted from the values of said plurality of reference symbols, and an order which is an indicator of a percentage of accurate prediction;

(b) a detector for detecting whether all the values of the plurality of reference symbols for a plurality of consecutive symbols being decoded are a specific reference symbol pattern if it is assumed that the predicted values of said plurality of consecutive symbols being decoded are coincident with the actual values thereof; and (c) an arithmetic decoder for decoding said code bit stream and for generating a prediction error signal on the basis of the information on said order stored in said order and predicted value memory.

19. A decoding device as in claim 18, further including:

(d) means for judging whether or not values of said plurality of reference symbols for said symbol being decoded are coincident with the values of said plurality of reference symbols for said symbol which the object of a preceding decoding operation; and (e) an order and predicted value controller for updating said predicted value and said order which correspond to the values of said plurality of reference symbols in said order and predicted value memory in accordance with the result of said judgment.

* * * * *